(12) United States Patent
Aoyama et al.

(10) Patent No.: US 8,860,515 B2
(45) Date of Patent: Oct. 14, 2014

(54) ATOMIC OSCILLATOR, CONTROL METHOD OF ATOMIC OSCILLATOR AND QUANTUM INTERFERENCE APPARATUS

(71) Applicant: Seiko Epson Corporation, Tokyo (JP)

(72) Inventors: Taku Aoyama, Setagaya (JP); Tetsuya Takahashi, Okaya (JP)

(73) Assignee: Seiko Epson Corporation (JP)

( * ) Notice: Subject to any disclaimer, the term of this patent is extended or adjusted under 35 U.S.C. 154(b) by 124 days.

(21) Appl. No.: 13/707,905

(22) Filed: Dec. 7, 2012

(65) Prior Publication Data

US 2013/0147565 A1 Jun. 13, 2013

(30) Foreign Application Priority Data

Dec. 9, 2011 (JP) ................................. 2011-269998

(51) Int. Cl.
*H01S 1/06* (2006.01)
*G04F 5/14* (2006.01)
*H03B 17/00* (2006.01)

(52) U.S. Cl.
CPC . *H03B 17/00* (2013.01); *G04F 5/14* (2013.01)
USPC .............................................. 331/94.1; 331/3

(58) Field of Classification Search
USPC ........................................................ 331/94.1
See application file for complete search history.

(56) References Cited

U.S. PATENT DOCUMENTS

| | | | |
|---|---|---|---|
| 6,265,945 B1 | 7/2001 | Delaney et al. | |
| 6,320,472 B1 | 11/2001 | Vanier | |
| 6,359,916 B1 | 3/2002 | Zhu | |
| 6,806,784 B2 | 10/2004 | Hollberg et al. | |
| 7,345,553 B2 | 3/2008 | Berberian et al. | |
| 2002/0163394 A1 | 11/2002 | Hollberg et al. | |
| 2010/0201452 A1 | 8/2010 | Aoyama et al. | |
| 2011/0063037 A1 | 3/2011 | Aoyama et al. | |

FOREIGN PATENT DOCUMENTS

| | | |
|---|---|---|
| JP | 2002-344314 | 11/2002 |
| JP | 2004-096410 | 3/2004 |
| JP | 2009-141048 | 6/2009 |
| JP | 2010-206767 | 9/2010 |
| JP | 2010-226424 | 10/2010 |
| JP | 2011-066111 | 3/2011 |
| JP | 2011-091476 | 5/2011 |

*Primary Examiner* — Joseph Chang
*Assistant Examiner* — Jeffrey Shin
(74) *Attorney, Agent, or Firm* — Harness, Dickey & Pierce, P.L.C.

(57) ABSTRACT

An atomic oscillator, a control method of the atomic oscillator and a quantum interference apparatus are provided in which high frequency stability can be maintained even though EIT signal intensity changes.

9 Claims, 18 Drawing Sheets

ATOMIC OSCILLATOR, CONTROL METHOD OF ATOMIC OSCILLATOR AND QUANTUM INTERFERENCE APPARATUS

BACKGROUND

1. Technical Field

The present invention relates to an atomic oscillator, a control method of the atomic oscillator and a quantum interference apparatus.

2. Related Art

As shown in FIG. 19, it is known that an alkali metal atom has a ground level represented by a term symbol $^2S_{1/2}$ and two excited levels represented by term symbols $^2P_{1/2}$ and $^2P_{3/2}$. Further, each level of $^2S_{1/2}$, $^2P_{1/2}$ and $^2P_{3/2}$ has an ultrafine structure split into plural energy levels. Specifically, $^2S_{1/2}$ has two ground levels of I+1/2 and I−1/2, $^2P_{1/2}$ has two excited levels of I+1/2 and I−1/2 and $^2P_{3/2}$ has four excited levels of I+3/2, I+1/2, I−1/2 and I−3/2. Here, I is a nuclear spin quantum number.

An atom, which is in the ground level of I−1/2 of $^2S_{1/2}$, can transit to the excited level of one of I+1/2, I−1/2 and I−3/2 of $^2P_{3/2}$ by absorbing a D2 ray but cannot transit to the excited level of I+3/2. An atom, which is in the ground level of I+1/2 of $^2S_{1/2}$, can transit to the excited level of one of I+3/2, I+1/2 and I−1/2 of $^2P_{3/2}$ by absorbing a D2 ray but cannot transit to the excited level of I−3/2. These depend on a transition selection rule when assuming an electric dipole transition. Conversely, an atom which is in the excited level of I+1/2 or I−1/2 of $^2P_{3/2}$ emits the D2 ray and can transit to the ground level (one of the original ground level or the other ground level) of I+1/2 or I−1/2 of $^2S_{1/2}$. Here, three levels (configured of two ground levels and one excited level) configured of two ground levels of I+1/2 and I−1/2 of $^2S_{1/2}$ and the excited level of I+1/2 or I−1/2 of $^2P_{3/2}$ are referred to as Λ-type three-level system because the transition of Λ-type can be performed by absorption and emission of the D2 ray. Meanwhile, an atom which is in the excited level of I−3/2 of $^2P_{3/2}$ emits the D2 ray and necessarily transits to the ground level (the original ground level) of I−1/2 of $^2S_{1/2}$ and similarly, an atom which is in the excited level of I+3/2 of $^2P_{3/2}$ emits the D2 ray and necessarily transits to the ground level (the original ground level) of I+1/2 of $^2S_{1/2}$. That is, three levels configured of two ground levels of I+1/2 and I−1/2 of $^2S_{1/2}$ and the excited level of I−3/2 or I+3/2 of $^2P_{3/2}$ do not form the Λ-type three-level system because the transition of the Λ-type cannot be performed by absorption and emission of the D2 ray.

Meanwhile, when a resonant light beam (referred to as a resonant light beam 1) having a frequency corresponding to an energy difference between a first ground level (the ground level of I−1/2 of $^2S_{1/2}$) forming the Λ-type three-level system and the excited level (for example, the excited level of I+1/2 of $^2P_{3/2}$), and a resonant light beam (referred to as a resonant light beam 2) having a frequency corresponding to an energy difference between a second ground level (the ground level of I+1/2 of $^2S_{1/2}$) and the excited level are simultaneously irradiated, it becomes a superimposed state of two ground levels, that is, a quantum coherence state (a dark state) and it is known that an Electromagnetically Induced Transparency (EIT) phenomenon (also referred to as CPT (Coherent Population Trapping)), in which excitation to the excited level is stopped, occurs. The frequency difference of a resonant light beam pair (the resonant light beam 1 and the resonant light beam 2) producing the EIT phenomenon accurately matches with a frequency corresponding to the energy difference $\Delta E_{12}$ between two ground levels of the alkali metal atom. For example, in a cesium atom, when the frequency corresponding to the energy difference between two ground levels is 9.192631770 GHz so that when the two kinds of laser light beams of the D1 ray or the D2 ray having a frequency difference of 9.192631770 GHz are simultaneously irradiated to the cesium atom, the EIT phenomenon occurs.

Accordingly, as shown in FIG. 20, when the light beam having the frequency $f_1$ and the light beam having the frequency $f_2$ are simultaneously irradiated to the gaseous alkali metal atom, the two kinds of light beams become the resonant light beam pair and then the intensity of light beam which passes through the alkali metal atom abruptly changes according to whether or not the alkali metal atom produces the EIT phenomenon. The signal representing the transmitted intensity of light beam, which is abruptly changed, is referred to as an EIT signal and when the frequency difference $f_1-f_2$ of the resonant light beam pair accurately matches with the frequency $f_{12}$ corresponding to $\Delta E_{12}$, the level of the EIT signal indicates a peak value. Then, the peak top of the EIT signal is detected and the frequency difference $f_1-f_2$ of the two kinds of light beams irradiating the alkali metal atom is controlled to accurately match with the frequency $f_{12}$ corresponding to $\Delta E_{12}$ so that an oscillator having high accuracy can be realized.

FIG. 21 is a schematic view of a general configuration of an atomic oscillator according to an EIT system of the related art. As shown in FIG. 21, the atomic oscillator according to the EIT system of the related art produces light beam having the frequency $f_0+f_m$ and light beam having the frequency $f_0-f_m$ with modulation applied to a semiconductor laser by superimposing the modulation signal having the frequency $f_m$ to a drive current for setting the frequency $f_0$ (=v/$\lambda_0$:v is the speed of the light beam and $\lambda_0$ is the wavelength of the light beam) produced by a current drive circuit. The two kinds of light beams are simultaneously irradiated to a gas cell and the intensity of light beam which passes through the gas cell is detected by a light detector. The gas cell is configured of the gaseous alkali metal atoms and a container enclosed with the gaseous alkali metal atoms and when the two kinds of light beams which are simultaneously irradiated become the resonant light beam pair, the alkali metal atom produces the EIT phenomenon and the intensity of light beam which passes through the gas cell is large. Then, the atomic oscillator performs the detection using a low frequency signal of approximately several tens of Hz to several hundreds of Hz produced by a low frequency oscillator and controls the oscillation frequency of a Voltage Controlled Crystal Oscillator (VCXO), and outputs a modulation signal having the frequency $f_m$ via a PLL (Phase Locked Loop) so that the intensity of light beam which is detected by the light detector becomes the maximum. According to the configuration described above, the control is performed so that the frequency difference $2f_m$ between the light beam having the frequency $f_0+f_m$ emitted by the semiconductor laser and the light beam having the frequency $f_0-f_m$ matches with the frequency corresponding to $\Delta E_{12}$, that is, the frequency $f_m$ of the modulation signal matches with the frequency of ½ of the frequency corresponding to $\Delta E_{12}$. Accordingly, the oscillating operation of the voltage controlled crystal oscillator (VCXO) can be very stably continued and an oscillation signal having a very high frequency stability can be produced.

U.S. Pat. No. 6,320,472 is an example of the related art.

However, in the atomic oscillator of the related art, the premise is that the EIT signal is left-right symmetrical in order to perform the control so that the peak top of the EIT signal is detected by the detection using the low frequency signal and the frequency $f_m$ of the modulation signal accurately matches with the frequency of ½ of the frequency corresponding to $\Delta E_{12}$. Conversely, in the atomic oscillator of the related art, when the EIT signal is left-right asymmetrical, it is possible that the frequency $f_m$ of the modulation signal and the frequency of ½ of the frequency corresponding to $\Delta E_{12}$ may be stable in a slightly shifted state. Even in this state, high stability of the frequency is ensured and accuracy of the frequency can also be ensured, for example, by adding a circuit which converts the oscillation frequency of the voltage controlled crystal oscillator (VCXO) into a desired frequency, to the atomic oscillator.

However, when the peak value (the intensity) of the EIT signal changes and then the degree of asymmetry changes due to an abrupt change in the temperature of the ambient environment or the like, the difference between the frequency $f_m$ of the modulation signal and the frequency of ½ of the frequency corresponding to $\Delta E_{12}$ changes, which causes the frequency stability of the atomic oscillator to be decreased.

SUMMARY

An advantage of some aspects of the invention is to provide an atomic oscillator, a control method of the atomic oscillator and a quantum interference apparatus in which high frequency stability can be maintained even though EIT signal intensity changes.

(1) An aspect of the invention is directed to an atomic oscillator, which produces an electromagnetically induced transparency phenomenon in a metal atom with a resonant light beam pair, and includes a control signal output section which outputs a frequency-modulated control signal; a light generation section which produces a first light beam and a second light beam having a frequency difference according to the frequency of the control signal; a metal atom to which the first light beam and the second light beam are irradiated; a light detection section which detects the light beam passed through the metal atom; a frequency controller which controls the frequency of the control signal so that the first light beam and the second light beam become the resonant light beam pair, based on the detection signal of the light detection section; and a maximum frequency deviation controller which controls maximum frequency deviation of the control signal, according to the detection signal of the light detection section.

According to the aspect of the invention, the first light beam and the second light beam having a frequency difference according to the frequency of the control signal are irradiated to the metal atom, and the frequency of the control signal is controlled so that the light beams passed through the metal atom are detected and the first light beam and the second light beam irradiated to the metal atom become the resonant light beam pair which produces the electromagnetically induced transparency phenomenon in the metal atom. Since the frequency difference between the first light beam and the second light beam can be maintained constant by the feedback control, the oscillation signal having a stable frequency can be obtained.

Specifically, in the aspect of the invention, the maximum frequency deviation of the control signal is controlled by the detection signal of the light detection section, variation of the frequency of the oscillation signal due to the change of the EIT signal intensity can be canceled by the variation of the frequency of the oscillation signal due to the change of the maximum frequency deviation so that the frequency of the oscillation signal can be maintained constant even though the EIT signal intensity changes. Accordingly, the atomic oscillator having a frequency stability higher than that of the related art can be realized.

(2) The atomic oscillator may be configured such that the control signal output section includes the oscillation signal output section which outputs the oscillation signal of the frequency according to an output signal of the frequency controller; a modulation signal output section which outputs the given modulation signal; a frequency modulation section which performs the frequency modulation from the oscillation signal to the modulation signal; and a frequency conversion section which converts the frequency of the output signal of the frequency modulation section and then outputs the control signal, and the frequency controller detects the detection signal of the light detection section, based on the signal having the same frequency as the modulation signal, and the maximum frequency deviation controller controls an amplitude of the modulation signal, based on the detection signal of the light detection section.

(3) The atomic oscillator may be configured such that the maximum frequency deviation controller controls the amplitude of the modulation signal according to a corresponding relation between detection signal intensity of the light detection section and the maximum frequency deviation of the control signal, which makes the frequency of the control signal be constant.

(4) The atomic oscillator may be configured such that the maximum frequency deviation controller stores the information of the corresponding relation between detection signal intensity of the light detection section and the maximum frequency deviation of the control signal, and controls the maximum frequency deviation of the control signal, which makes the frequency of the control signal be constant, based on information of the corresponding relation.

It is assumed the corresponding relation between the detection signal intensity of the light detection section and the maximum frequency deviation of the control signal may be different for every sample due to the variation or the like of the manufacturing condition so that the variation of the EIT signal characteristics can be absorbed by obtaining and storing the corresponding relation for every sample in advance. Accordingly, high frequency stability can be ensured without depending on the samples.

(5) The atomic oscillator may further include a maximum frequency deviation information changing section which changes the information of the corresponding relation, based on the signal from the outside of the atomic oscillator.

According to this configuration, even though the EIT signal characteristics change with across the ages, high frequency stability can be maintained over the long term by again obtaining the corresponding relation of the detection signal intensity of the light detection section and the maximum frequency deviation of the control signal, and by updating the information of the stored corresponding relation.

(6) Another aspect of the invention is directed to a control method of the atomic oscillator in which an electromagnetically induced transparency phenomenon is produced in a metal atom by a resonant light beam pair, and including outputting control signal in which frequency modulation is performed; producing a first light beam and a second light beam having a frequency difference according to the frequency of the control signal; irradiating the first light beam and the second light beam to the metal atom; detecting the light beam which passed through the metal atom; controlling the frequency of the control signal so that the first light beam and the second light beam become the resonant light beam pair, based on detection result of the detecting of the light beam; and controlling the maximum frequency deviation of the control signal, according to the detection result of the detecting of the light beam.

(7) Still another aspect of the invention is directed to a quantum interference apparatus, which produces an electromagnetically induced transparency phenomenon in a metal atom with a resonant light beam pair, and includes a control signal output section which outputs a frequency-modulated control signal; a light generation section which produces a first light beam and a second light beam having a frequency difference according to the frequency of the control signal; a metal atom to which the first light beam and the second light beam are irradiated; a light detection section which detects the light beam passed through the metal atom; a frequency controller which controls the frequency of the control signal so that the first light beam and the second light beam become the resonant light beam pair, based on the detection signal of the light detection section; and a maximum frequency deviation controller which controls maximum frequency deviation of the control signal, according to the detection signal of the light detection section.

According to the aspect of the invention, the first light beam and the second light beam having a frequency difference according to the frequency of the control signal are irradiated to the metal atom, and the frequency of the control signal is controlled so that the light beams passed through the metal atom are detected and the first light beam and the second light beam irradiated to the metal atom become the resonant light beam pair which produces the electromagnetically induced transparency phenomenon in the metal atom. Since the frequency difference between the first light beam and the second light beam can be maintained constant by the feedback control, the oscillation signal having a stable frequency can be obtained.

Specifically, in the aspect of the invention, the maximum frequency deviation of the control signal is controlled by the detection signal of the light detection section, variation of the frequency of the oscillation signal due to the change of the EIT signal intensity can be canceled by the variation of the frequency of the oscillation signal due to the change of the maximum frequency deviation so that the frequency of the oscillation signal can be maintained constant even though the EIT signal intensity changes. Accordingly, the quantum interference apparatus having a frequency stability higher than that of the related art can be realized.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention are described in detail using the drawings. In addition, the embodiments described below do not limit the content of the invention described in the appended claims. In addition, all configurations described below are not necessarily the essential configuration requirements of the invention.

1. Quantum Interference Apparatus

Figure 1:
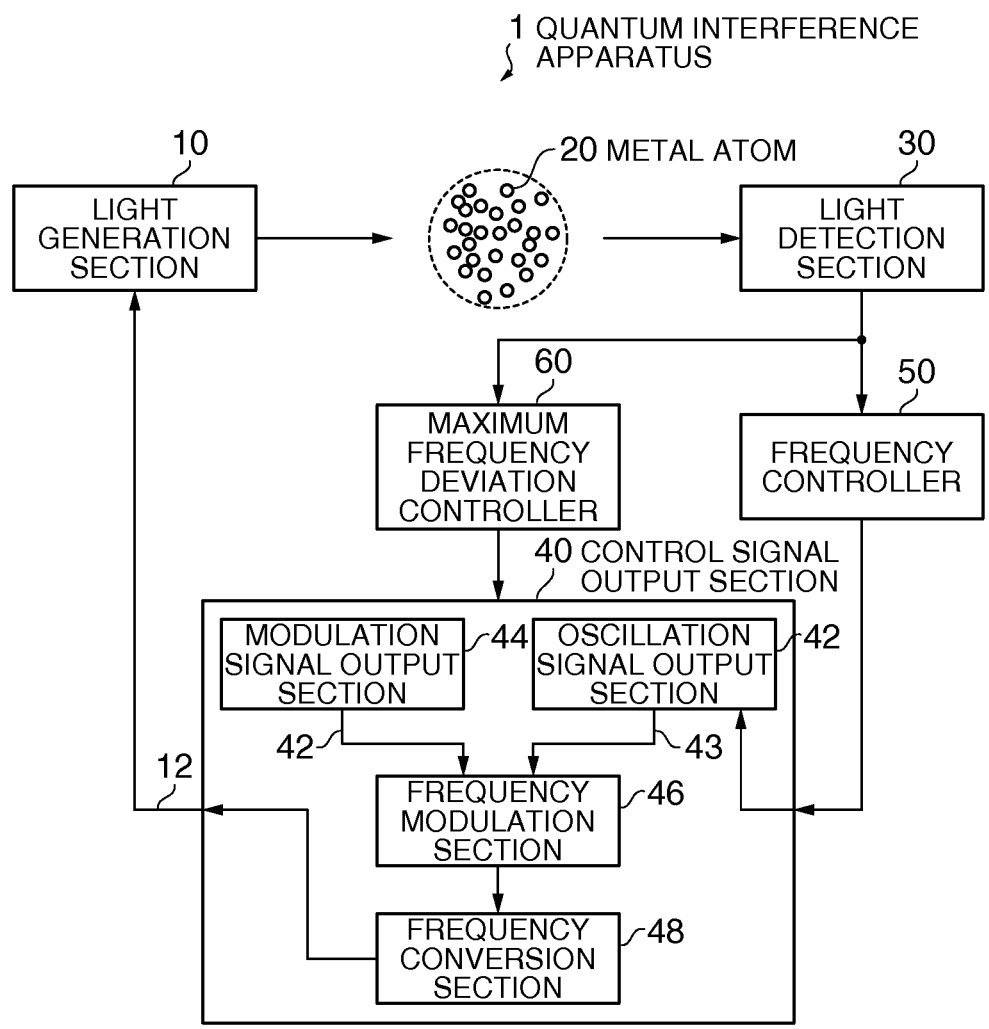
FIG. 1 is a functional block diagram of a quantum interference apparatus of the embodiment.

FIG. 1 is a functional block diagram of the quantum interference apparatus of the embodiment. A quantum interference apparatus 1 of the embodiment is configured to include a light generation section 10, a metal atom. 20, a light detection section 30, a control signal output section 40, a frequency controller 50 and a maximum frequency deviation controller 60.

The control signal output section 40 outputs a control signal 12 which is frequency modulated.

The light generation section 10 produces a first light beam and a second light beam having a frequency difference according to the frequency of the control signal 12.

The metal atom 20 is a metal atom having an Λ-type three-level system and is an alkali metal atom such as sodium (Na) atom, rubidium (Rb) atom, and cesium (Cs) atom.

The light detection section 30 detects the light beam which is irradiated from the light generation section 10 and passed through the metal atom 20.

The frequency controller 50 controls the frequency of the control signal 12 so that the first light beam and the second light beam become a resonant light beam pair (a resonant light beam pair which generates an electromagnetically induced transparency phenomenon in the metal atom 20), based on the detection signal of the light detection section 30.

The maximum frequency deviation controller 60 controls the maximum frequency deviation of the control signal 12 according to the detection signal of the light detection section 30. The maximum frequency deviation controller 60 stores, for example, information of a correspondence relationship between the detection signal intensity of the light detection section 30 which makes the frequency of the control signal 12 be constant and the maximum frequency deviation of the control signal 12. The maximum frequency deviation controller 60 may control the maximum frequency deviation of the control signal 12, based on the information of the corresponding relation.

The control signal output section 40 may be configured to include an oscillation signal output section 42, a modulation signal output section 44, a frequency modulation section 46 and a frequency conversion section 48.

The oscillation signal output section 42 outputs an oscillation signal 43 of the frequency according to the output signal of the frequency controller 50.

The modulation signal output section 44 outputs a given modulation signal 45.

The frequency modulation section 46 performs the frequency modulation from the oscillation signal 43 to the modulation signal 45.

The frequency conversion section 48 outputs the control signal 12 by converting the frequency of the output signal of the frequency modulation section 46.

The frequency controller 50, for example, may detect the detection signal of the light detection section 30, based on the signal of the same frequency as the modulation signal 45.

The maximum frequency deviation controller 60, for example, may control the amplitude of the modulation signal 45, based on the detection signal of the light detection section 30. The maximum frequency deviation controller 60, for example, may control the amplitude of the modulation signal according to the corresponding relation between the detection signal intensity of the light detection section 30 which makes the frequency of the control signal 12 be constant and the maximum frequency deviation of the control signal 12.

Figure 2:
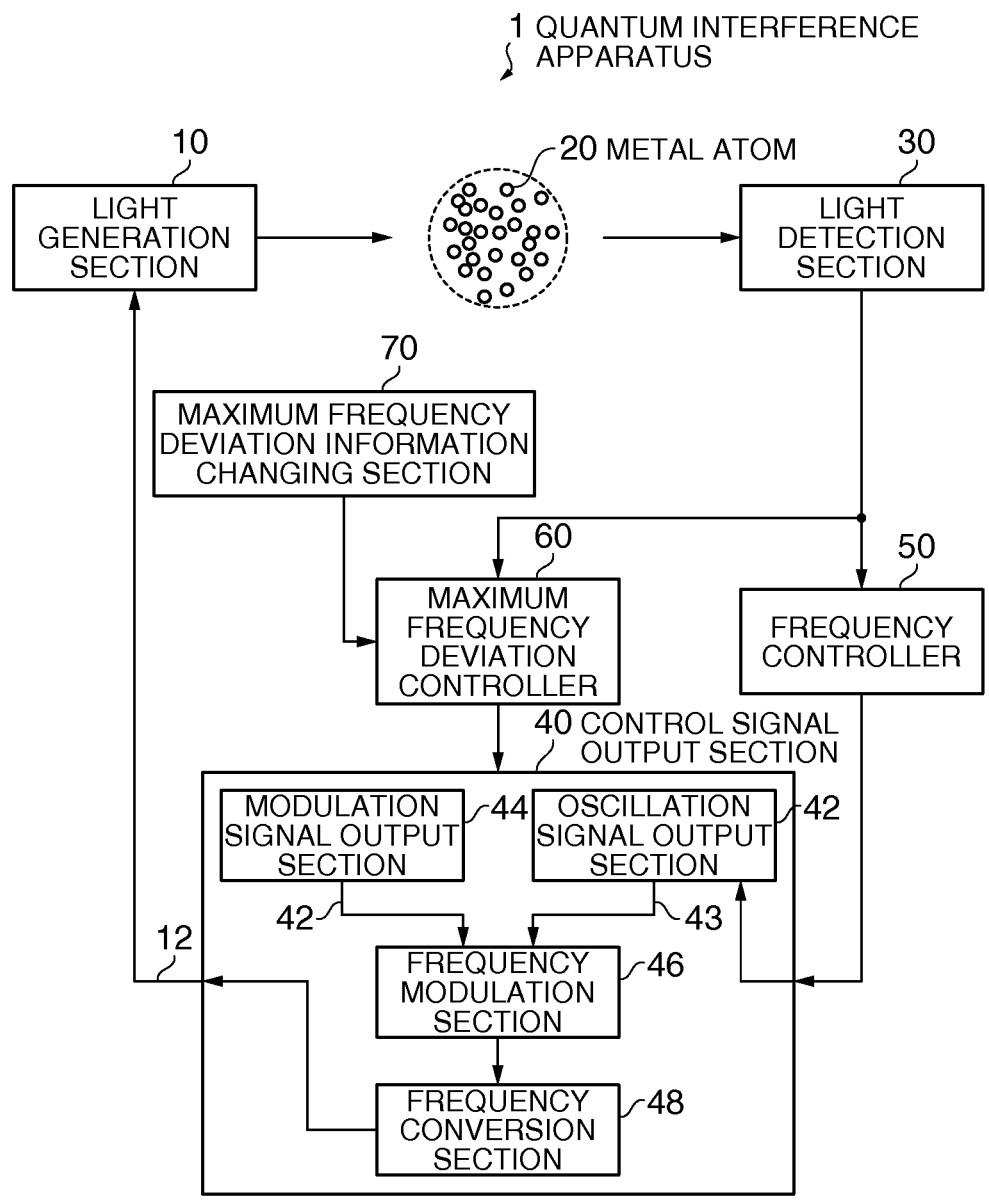
FIG. 2 is another functional block diagram of the quantum interference apparatus of the embodiment.

FIG. 2 is another functional block diagram of the quantum interference apparatus of the embodiment. As shown in FIG. 2, in the quantum interference apparatus 1 of the embodiment, a maximum frequency deviation information changing section 70 is added to the quantum interference apparatus 1 shown in FIG. 1.

The maximum frequency deviation information changing section 70 changes information of the corresponding relation between the detection signal intensity of the light detection section 30 and the maximum frequency deviation of the control signal 12, based on the signal from the outside of the quantum interference apparatus 1.

Since function of other configuration in addition thereto in FIG. 2 is similar to FIG. 1, the same reference numeral is applied and description thereof is omitted.

Hereinafter, the atomic oscillator is described in detail as an example of the quantum interference apparatus 1.

2. Atomic Oscillator
2-1. First Embodiment

Figure 3:
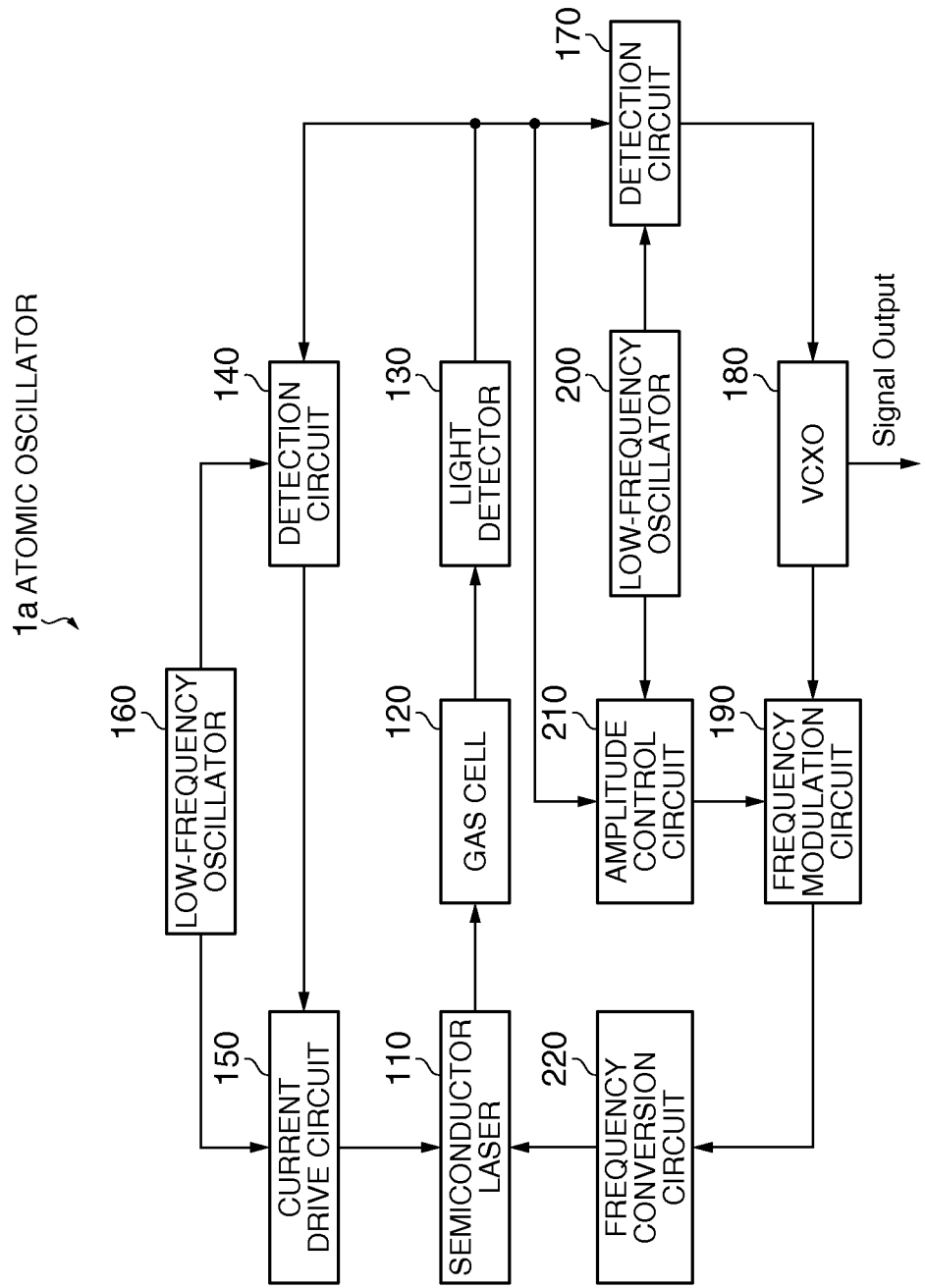
FIG. 3 is a view illustrating a configuration example of an atomic oscillator of a first embodiment.

FIG. 3 is a view illustrating a configuration example of the atomic oscillator of the first embodiment. As shown in FIG. 3, the atomic oscillator 1a of the first embodiment is configured to include a semiconductor laser 110, a gas cell 120, a light detector 130, a detection circuit 140, a current drive circuit 150, a low-frequency oscillator 160, a detection circuit 170, a voltage controlled crystal oscillator (VCXO) 180, a frequency modulation circuit 190, a low-frequency oscillator 200, an amplitude control circuit 210 and a frequency conversion circuit 220.

The gas cell 120 encloses the gaseous alkali metal atoms in the container.

The semiconductor laser 110 produces plural light beams having different frequencies and irradiates the light beams to the gas cell 120. Specifically, control of a center wavelength $\lambda_0$ (a center frequency $f_0$) of the light beam irradiated from the semiconductor laser 110 is performed by the driving current which is output from the current drive circuit 150. Thus, the semiconductor laser 110 is modulated by the output signal of the frequency conversion circuit 220 as the modulation signal. That is, the semiconductor laser 110 emits the light beam which is modulated by superimposing the output signal (the modulation signal) of the frequency conversion circuit 220 to the drive current in the current drive circuit 150. The semiconductor laser 110 described above can be realized, for example, with an Edge Emitting laser or the like, Vertical Cavity Surface Emitting Laser (VCSEL) or the like.

The light detector 130 detects the light beam passed through the gas cell 120 and outputs the detection signal according to the intensity of light beam. As described above, when the two kinds of light beams, in which the frequency difference matches with the frequency corresponding to the energy difference $\Delta E_{12}$ of two ground levels of the alkali metal atom, are irradiated to the alkali metal atom, the alkali metal atom produces the EIT phenomenon. The intensity of light beam passed through the gas cell 120 increases and the voltage level of the output signal of the light detector 130 becomes high when the number of the alkali metal atoms producing the EIT phenomenon is large.

The output signal of the light detector 130 is input to the detection circuit 140 and the detection circuit 170. The detection circuit 140 synchronously detects the output signal of the light detector 130 using the oscillation signal of the low-frequency oscillator 160 oscillating in a low frequency of about several Hz to several hundreds of Hz.

The current drive circuit 150 produces a drive current having a size according to the output signal of the detection circuit 140 and supplies the output signal to the semiconductor laser 110, and performs control of the center wavelength $\lambda_0$ (the center frequency $f_0$) of the light beam emitted from the semiconductor laser 110. Specifically, the control is performed on a wavelength $\lambda_1$ (a frequency $f_1$) corresponding to the energy difference between the excited level (may be the excited level of I+1/2) of I−1/2 of $^2P_{3/2}$ of the alkali metal atom and the ground level of I−1/2 of $^2S_{1/2}$, and a wavelength $\lambda_2$ (a frequency $f_2$) corresponding to the energy difference between the excited level (may be the excited level of I+1/2) of I−1/2 of $^2P_{3/2}$ of the alkali metal atom and the ground level of I+1/2 of $^2S_{1/2}$ so that the center wavelength $\lambda_0$ matches with $(\lambda_1+\lambda_2)/2$ (the center frequency $f_0$ matches with $(f_1+f_2)/2$). Otherwise, the control may be performed on a wavelength $\lambda_1$ (the frequency $f_1$) corresponding to the energy difference between the excited level (may be the excited level of I+1/2) of I−1/2 of $^2P_{1/2}$ of the alkali metal atom and the ground level of I−1/2 of $^2S_{1/2}$, and a wavelength $\lambda_2$ (the frequency $f_2$) corresponding to the energy difference between the excited level (may be the excited level of I+1/2) of I−1/2 of $^2P_{1/2}$ of the alkali metal atom and the ground level of I+1/2 of $^2S_{1/2}$ so that the center wavelength $\lambda_0$ matches with $(\lambda_1+\lambda_2)/2$ (the center frequency $f_0$ matches with $(f_1+f_2)/2$).

However, in either case, it is not required that the center wavelength $\lambda_0$ necessarily and accurately matches with $(\lambda_1+\lambda_2)/2$ and it may be the wavelength having a predetermined range including $(\lambda_1+\lambda_2)/2$. In addition, the oscillation signal (the same signal as the oscillation signal supplied to the detection circuit 140) of the low-frequency oscillator 160 is superimposed to the drive current produced by the current drive circuit 150 so that the synchronous detection can be performed using the detection circuit 140.

The center wavelength $\lambda_0$ (the center frequency $f_0$) of the light beam produced by the semiconductor laser 110 is adjusted in detail by a feedback loop through the semiconductor laser 110, the gas cell 120, the light detector 130, the detection circuit 140 and the current drive circuit 150.

The detection circuit 170 synchronously detects the output signal of the light detector 130 using the oscillation signal of the low-frequency oscillator 200 which is oscillated in a low frequency of about several Hz to several hundreds of Hz. Thus, the oscillation frequency of the voltage controlled crystal oscillator (VCXO) 180 is adjusted in detail according to the size of the output signal of the detection circuit 170. The voltage controlled crystal oscillator (VCXO) 180 oscillates at, for example, about several MHz to several tens of MHz.

The amplitude control circuit 210 performs control of the amplitude of the oscillation signal of the low-frequency oscillator 200 according to the level of the detection signal of the light detector 130.

The frequency modulation circuit 190 performs the frequency modulation (FM) of the output signal of the voltage controlled crystal oscillator (VCXO) 180 using the output signal (the oscillation signal of the low-frequency oscillator 200 in which the amplitude is adjusted) of the amplitude control circuit 210 as the modulation signal so that the synchronous detection can be performed using the detection circuit 170.

The frequency conversion circuit 220 performs frequency conversion of the output signal of the frequency modulation circuit 190 with a constant frequency conversion rate. For example, when a center value of the oscillation frequency of the voltage controlled crystal oscillator (VCXO) 180 is 10 MHz and the alkali metal atoms enclosed in the gas cell 120 are the cesium atoms, the frequency corresponding to $\Delta E_{12}$ is 9.192631770 GHz so that the frequency conversion rate is set to (9.192631770 GHz/10 MHz). The frequency conversion circuit 220 can be realized using, for example, the PLL (Phase Locked Loop) circuit.

In the atomic oscillator 1a configured as described above, when the EIT signal is the left-right symmetrical, the frequency of the output signal of the frequency conversion circuit 220 is adjusted in detail to accurately match with the frequency of ½ of the frequency corresponding to $\Delta E_{12}$ by the feedback loop through the semiconductor laser 110, the gas cell 120, the light detector 130, detection circuit 170, voltage controlled crystal oscillator (VCXO) 180, the frequency modulation circuit 190 and the frequency conversion circuit 220. For example, when the alkali metal atom is the cesium atom, the frequency corresponding to $\Delta E_{12}$ is 9.192631770 GHz so that the frequency of the output signal of the frequency conversion circuit 220 is stable in a state matched with 4.596315885 GHz.

Thus, as described above, the output signal of the frequency conversion circuit 220 becomes the modulation signal (the modulation frequency $f_m$) and the semiconductor laser 110 produces the plural light beams including resonant light beam pair and then irradiates the light beams to the gas cell 120.

Figure 4:
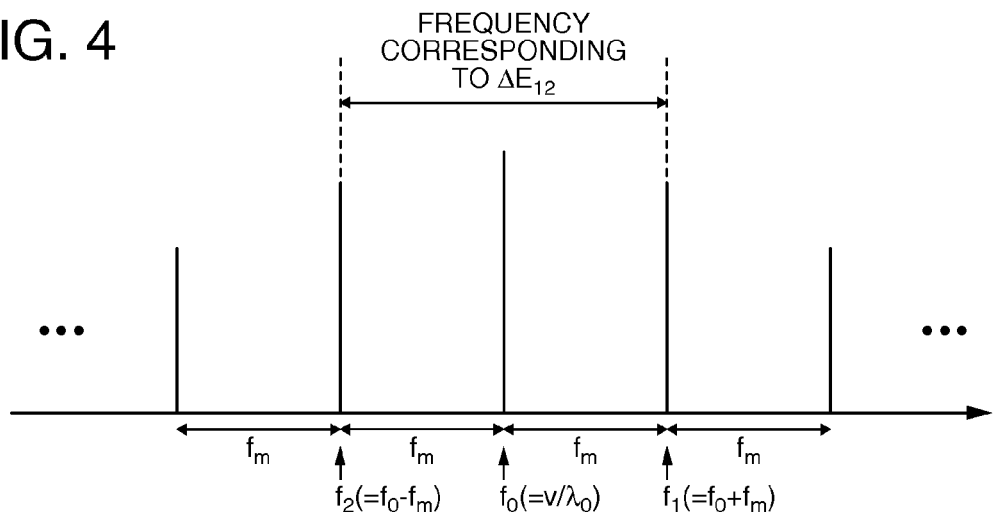
FIG. 4 is a schematic view illustrating a frequency spectrum of the light beam emitted from semiconductor laser.

FIG. 4 is a schematic view illustrating the frequency spectrum of the light beams emitted from the semiconductor laser 110. In FIG. 4, the lateral axis is the frequency of the light beam and the vertical axis is the intensity of light beam.

As shown in FIG. 4, the light beams emitted from the semiconductor laser 110 includes the light beam having the center frequency $f_0$ ($=v/\lambda_0$: v is the speed of the light beam and $\lambda_0$ is the center wavelength) and the plural light beams having frequencies which are different from each other by modulation frequency $f_m$ on both sides. Since the modulation frequency $f_m$ is the same as ½ of the frequency corresponding to $\Delta E_{12}$, the light beam having the frequency $f_1$ ($=f_0+f_m$) and the light beam having the frequency $f_2$ ($=f_0-f_m$) become the resonant light beam pair in which the difference thereof $f_1-f_2$ ($=2f_m$) is substantially the same as $\Delta E_{12}$ and the EIT phenomenon is produced in the alkali metal atoms enclosed in the gas cell 120.

In addition, the semiconductor laser 110, the alkali metal atom included in the gas cell 120, the light detector 130, the detection circuit 170 and the amplitude control circuit 210 shown in FIG. 3 correspond to the light generation section 10, the metal atom 20, the light detection section 30, the frequency controller 50 and the maximum frequency deviation controller 60 shown in FIG. 1 respectively. In addition, the configuration by the voltage controlled crystal oscillator (VCXO) 180, the frequency modulation circuit 190, the low-frequency oscillator 200 and the frequency conversion circuit 220 shown in FIG. 3 corresponds to the control signal output section 40 shown in FIG. 1. In addition, the voltage controlled crystal oscillator (VCXO) 180, the low-frequency oscillator 200, the frequency modulation circuit 190 and the frequency conversion circuit 220 shown in FIG. 3 correspond to the oscillation signal output section 42, the modulation signal output section 44, the frequency modulation section 46 and the frequency conversion section 48 shown in FIG. 1 respectively.

Next, an example of the synchronous detection of the output signal of the light detector 130 is described in detail.

First, when conceivable that there is no amplitude control circuit 210, the frequency modulation circuit 190 performs the frequency modulation of the output signal of the voltage controlled crystal oscillator (VCXO) 180 using the oscillation signal of the low-frequency oscillator 200 as the modulation signal.

Figure 5A:
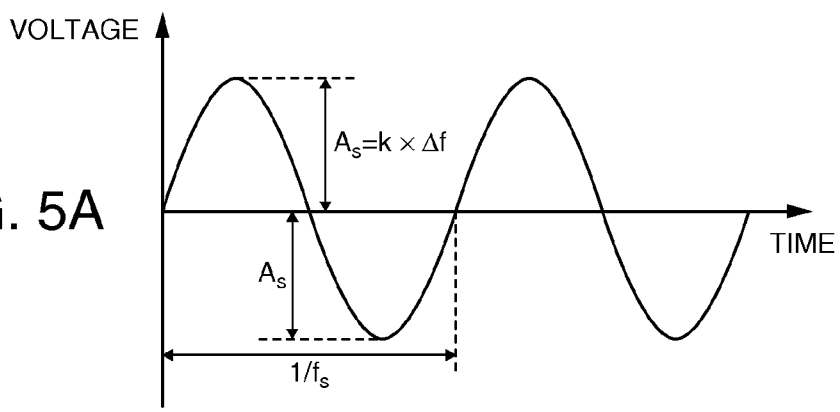
FIGS. 5A and 5B are explanatory views for frequency modulation.
Figure 5B:
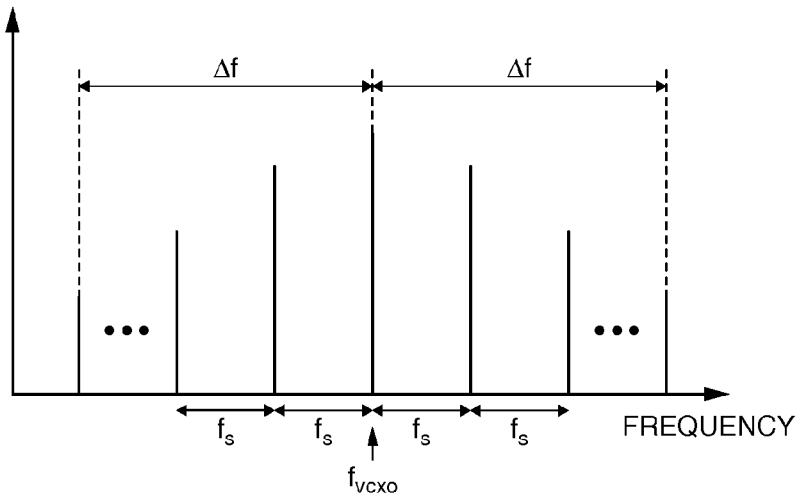

As shown in FIG. 5A, the oscillation signal of the low-frequency oscillator 200 is a sine wave having the frequency $f_s$ (a period is $1/f_s$) and the amplitude $A_s$, and the maximum frequency deviation $\Delta f$ is proportional to the amplitude $A_s$ thereof in the frequency modulation. FIG. 5B is a view illustrating the frequency spectrum of the output signal of the frequency modulation circuit 190. The output signal of the frequency modulation circuit 190 has an oscillation frequency $f_{vcxo}$ of the low-frequency oscillator 200 as the center frequency and includes plural frequency components with $f_s$ distance on both sides thereof. Thus, since the frequency of the output signal of the frequency modulation circuit 190 is $N(=f_m/f_{vcxo})$ times by the frequency conversion circuit 220, the output signal (the modulation signal of the semiconductor laser 110) of the frequency conversion circuit 220 exactly has the modulation frequency $f_m$ as the center frequency and includes plural frequency components with distances of $f_s \times N$ on both sides thereof.

Figure 6A:
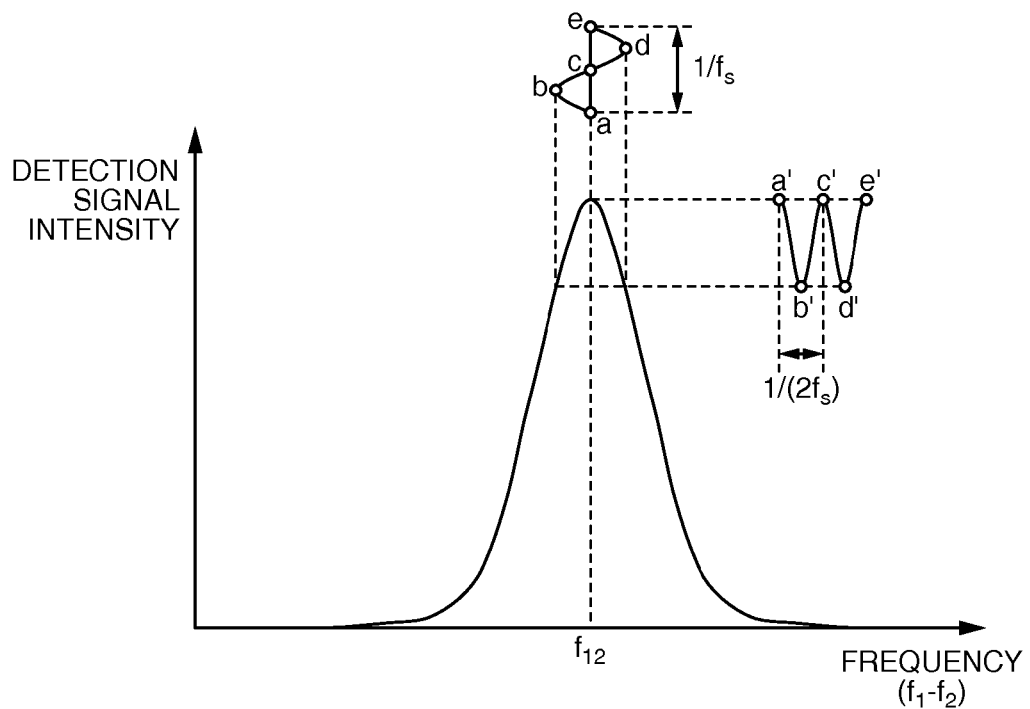
FIGS. 6A and 6B are explanatory views for detection.
Figure 6B:
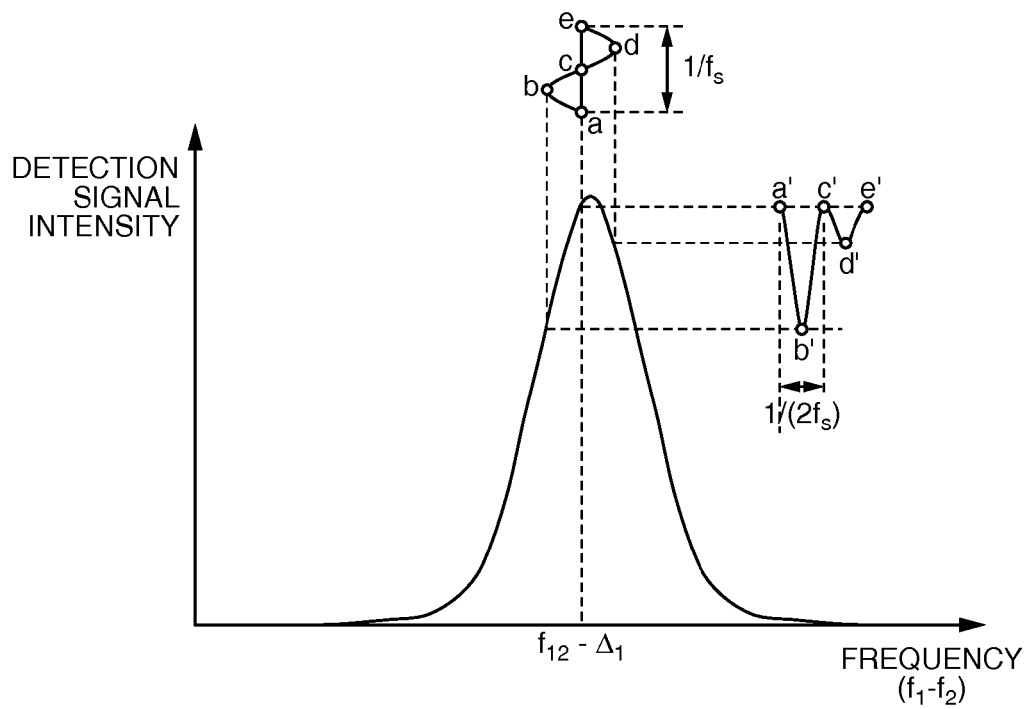

The semiconductor laser 110 is modulated by the output signal of the frequency conversion circuit 220 as the modulation signal. Accordingly, the light beam emitted from the semiconductor laser 110 exactly includes the light beam having each frequency component and plural light beams having the distances of $f_s \times N$ on both sides thereof as shown in FIG. 4. The plural light beams described above are irradiated to the gas cell 120 and the light beams passed through the gas cell 120 are detected by the light detector 130 so that the output signal of the light detector 130 includes a DC component and low frequency component. Specifically, when the frequency difference $f_1-f_2$ ($=2f_m$) of the resonant light beam pair shown in FIG. 4 accurately matches with the frequency $f_{12}$ corresponding to $\Delta E_{12}$, as shown in FIG. 6A, the detection signal of the light detector 130 includes a peak DC component and the low frequency component having the frequency of $2f_s$ and a constant amplitude. In addition, even though the frequency difference $f_1-f_2$ of the resonant light beam pair is shifted slightly from the frequency $f_{12}$ corresponding to $\Delta E_{12}$ (when $f_1-f_2=f_{12}-\Delta 1$), as shown in FIG. 6B, similarly, the detection signal of the light detector 130 includes the peak DC component and the low frequency component having the frequency of $2f_s$. However, the amplitude of the low frequency component having the frequency of $2f_s$ changes for every period and becomes the same amplitude for two periods ($1/f_s$).

Figure 7A:
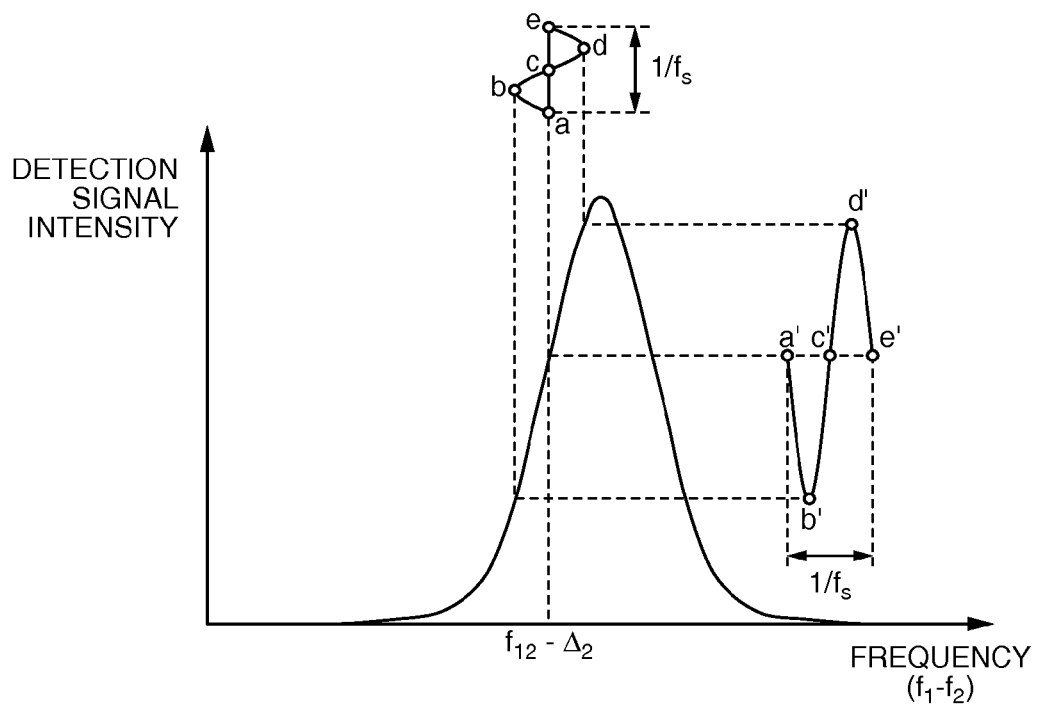
FIGS. 7A and 7B are explanatory views for detection.
Figure 7B:
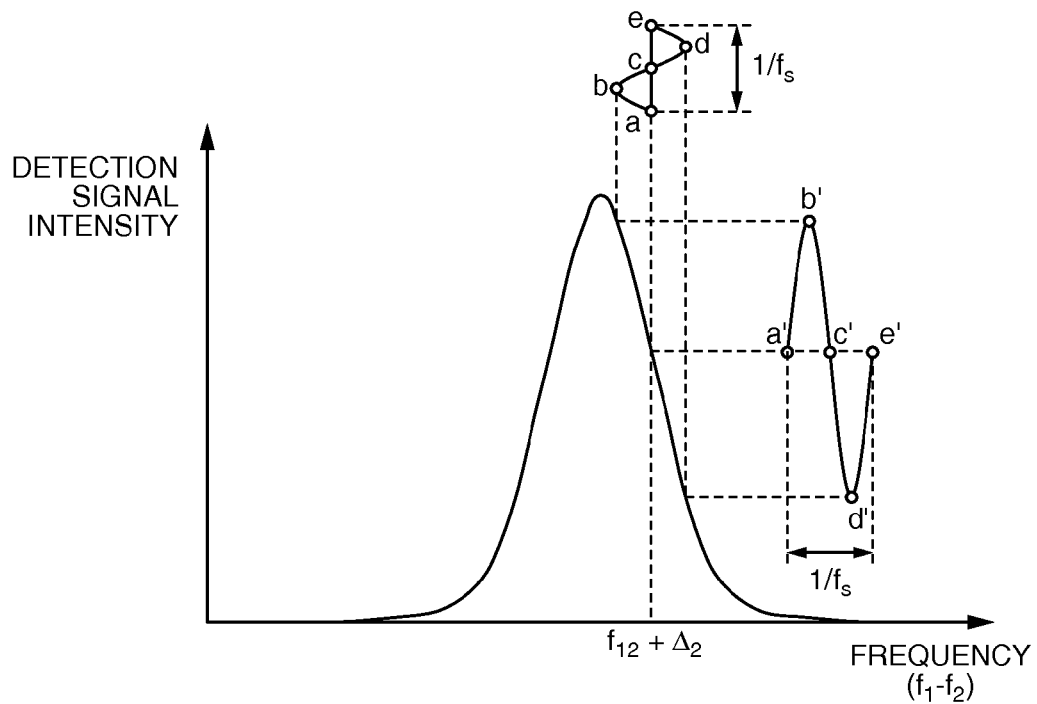

Meanwhile, when the frequency difference $f_1-f_2$ of the resonant light beam pair is shifted considerably from the frequency $f_{12}$ corresponding to $\Delta E_{12}$ (when $f_1-f_2=f_{12}-\Delta_2$ or $f_1-f_2=f_{12}+\Delta_2$), as shown in FIG. 7A or FIG. 7B, the detection signal of the light detector 130 includes the DC component and the low frequency component having the frequency fs.

Figure 8:
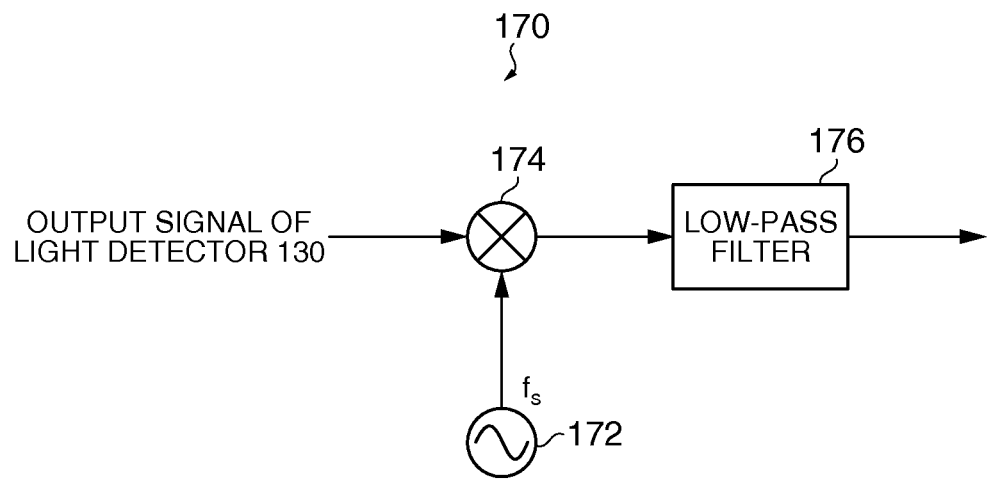
FIG. 8 is a view illustrating a configuration example of a detection circuit.

Then, the detection circuit 170 may have the configuration, for example, shown in FIG. 8. In other words, as shown in FIG. 8, the output signal of the light detector 130 and the oscillation signal having the constant frequency $f_s$ produced by a frequency generation source 172 are mixed in a mixer 174. The frequency $f_s$ outputs to the voltage controlled crystal oscillator (VCXO) 180 via a low-pass filter 176 included in an attenuation band. When the detection circuit 170 is configured described above, since a sum signal and a difference signal of the output signal of the light detector 130 and the oscillation signal having the frequency $f_s$ are produced in the output signal of the mixer 174, when the DC component included in the output signal of the light detector 130 is input to the mixer 174, only the signal having the frequency $f_s$ is produced in the output of the mixer 174 but is removed in the low-pass filter 176. In addition, when the output signal of the light detector 130 includes the low frequency component having the frequency 2fs as shown in FIG. 6A, if the low frequency component having the frequency $2f_s$ is input to the mixer 174, the signal having the frequency of $3f_s$ and the signal having the frequency $f_s$ are produced in the output of the mixer 174 but the signals are also removed in the low-pass filter 176. In other words, when the output signal of the light detector 130 is as shown in FIG. 6A, the voltage value of the output signal of the detection circuit 170 becomes 0 (the reference voltage value). Since the output signal of the detection circuit 170 is input to the voltage controlled crystal oscillator (VCXO) 180, the oscillation frequency of the voltage controlled crystal oscillator (VCXO) 180 does not change.

On the other hand, when the output signal of the light detector 130 includes the low frequency component having the frequency $2f_2$ as shown in FIG. 6B, if the low frequency component having the frequency $2f_s$ is input to the mixer 174, the signal having the frequency $3f_s$ and the signal having the frequency $f_s$ are produced in the output of the mixer 174 but the signals are also removed in the low-pass filter 176. However, since the low frequency component of $2f_s$ becomes the same amplitude as for two periods ($1/f_s$), the output signal of the light detector 130 also includes slightly the low frequency component having the frequency $f_s$. When the low frequency component having the frequency $f_s$ is input to the mixer 174, the output of the mixer 174 produces the signal having the frequency $2f_s$ and the DC signal having the positive voltage. The signal having the frequency $2f_s$ is removed in the low-pass filter 176, however, the DC signal having the positive voltage remains without removed. In other words, when the output signal of the light detector 130 is such as shown in FIG. 6B, the voltage value of the output signal of the detection circuit 170 becomes positive (the voltage value higher than the reference voltage value). If the output signal of the detection circuit 170 is input to the voltage controlled crystal oscillator (VCXO) 180, the oscillation frequency of the voltage controlled crystal oscillator (VCXO) 180 changes to the higher.

In addition, when the output signal of the light detector 130 includes the low frequency component having the frequency $f_s$ as shown in FIG. 7A, if the low frequency component having the frequency $f_s$ is input to the mixer 174, the output of the mixer 174 produces the signal having the frequency $2f_s$ and the DC signal of the positive voltage. The signal having the frequency $2f_s$ is removed in the low-pass filter 176, however, the DC signal of the positive voltage remains without removed. In other words, when the output signal of the light detector 130 is such as shown in FIG. 7A, the voltage value of the output signal of the detection circuit 170 becomes positive (the voltage value higher than the reference voltage value). If the output signal of the detection circuit 170 is input to the voltage controlled crystal oscillator (VCXO) 180, the oscillation frequency of the voltage controlled crystal oscillator (VCXO) 180 changes to the higher.

Similarly, when the output signal of the light detector 130 includes the low frequency component having the frequency $f_s$ as shown in FIG. 7B, if the low frequency component having the frequency $f_s$ is input to the mixer 174, the output of the mixer 174 produces the signal having the frequency $2f_s$ and the DC signal of the negative voltage. The signal having the frequency $2f_s$ is removed in the low-pass filter 176, however, the DC signal of the negative voltage remains without removed. In other words, when the output signal of the light detector 130 is such as shown in FIG. 7B, the voltage value of the output signal of the detection circuit 170 becomes negative (the voltage value lower than the reference voltage value). If the output signal of the detection circuit 170 is input to the voltage controlled crystal oscillator (VCXO) 180, the oscillation frequency of the voltage controlled crystal oscillator (VCXO) 180 changes to the lower.

As described above, the oscillation frequency of the voltage controlled crystal oscillator (VCXO) 180 is changed according to the voltage value of the output signal of the detection circuit 170. Accordingly, the feedback control can be performed so that the frequency difference $f_1-f_2$ of the resonant light beam pair matches with the frequency $f_{12}$ corresponding to $\Delta E_{12}$ (the frequency $f_m$ of the frequency conversion circuit 120 matches with the frequency of ½ of the frequency $f_{12}$ corresponding to $\Delta E_{12}$). However, in FIGS. 6A, 6B, 7A and 7B, it is premise that the EIT signal of the light beam passed through the gas cell 120 is left-right symmetrical and as a result, the detection signal intensity of the light detector 130 becomes the left-right symmetrical around the frequency difference $f_1-f_2=f_{12}$ of the resonant light beam pair.

Thus, the feedback control is performed and the frequency difference $f_1-f_2$ of the resonant light beam pair is stable in a state matched with the frequency $f_{12}$ corresponding to $\Delta E_{12}$ so that the detection signal intensity of the light detector 130 becomes peak.

Figure 9A:
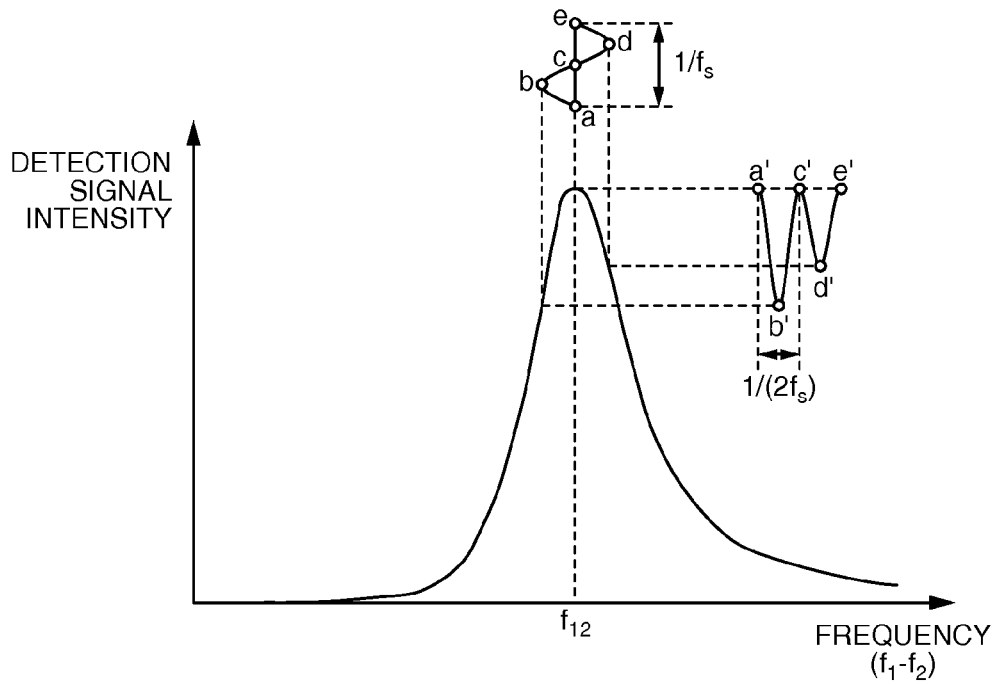
FIGS. 9A and 9B are explanatory views for the detection.

Meanwhile, when the EIT signal is left-right asymmetrical, the detection signal intensity of the light detector 130 also becomes left-right asymmetrical around the frequency difference $f_1-f_2=f_{12}$ of the resonant light beam pair. Thus, when the EIT signal is the frequency difference of the resonant light beam pair $f_1-f_2=f_{12}$, as shown in FIG. 9A, the amplitude of the low frequency component of the frequency $2f_s$ included in the detection signal of the light detector 130 does not become constant and the amplitude changes for every period, and becomes the same amplitude for two periods ($1/f_s$). Accordingly, when the low frequency component of the frequency $2f_s$ is input to the detection circuit 170, similar to the case shown in FIG. 6B, the voltage value of the output signal of the detection circuit 170 becomes positive (the voltage value higher than the reference voltage value). If the output signal of the detection circuit 170 is input to the voltage controlled crystal oscillator (VCXO) 180, the oscillation frequency of the voltage controlled crystal oscillator (VCXO) 180 changes to the higher.

Figure 9B:
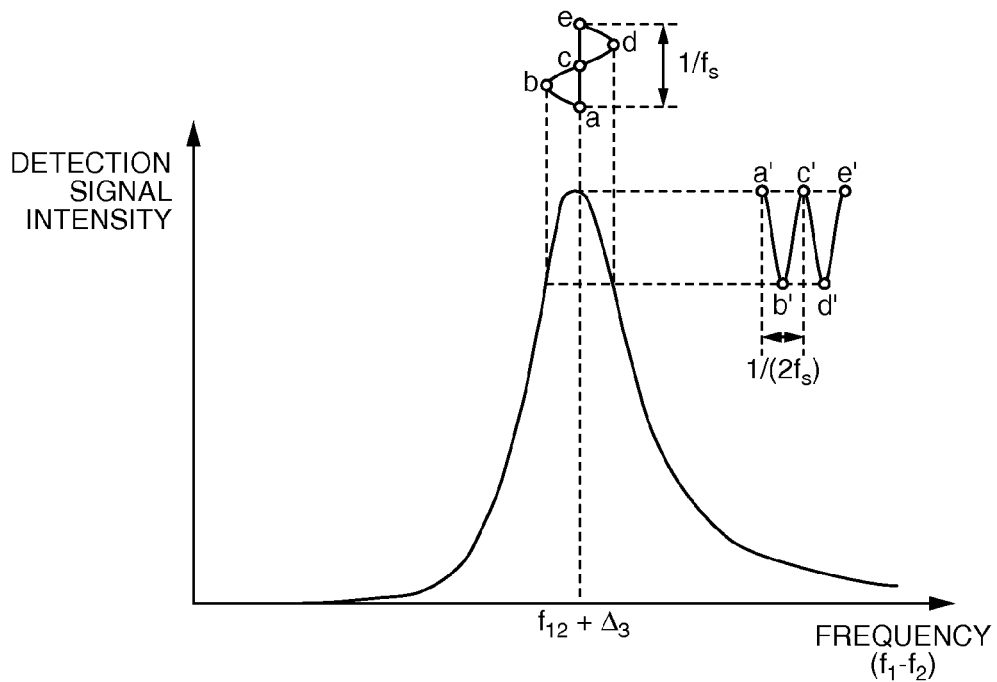

On the other hand, as shown in FIG. 9B, in a state where the frequency difference $f_1-f_2$ of the resonant light beam pair is shifted slightly from $f_{12}$ ($f_1-f_2=f_{12}+\Delta_3$), the amplitude of the low frequency component of the frequency $2f_s$ included in the detection signal of the light detector 130 becomes constant. Accordingly, when the low frequency component of the frequency $2f_s$ is input to the detection circuit 170, similar to the case shown in FIG. 6A, the voltage value of the output signal of the detection circuit 170 becomes 0 (the reference voltage value). Since the output signal of the detection circuit 170 is input to the voltage controlled crystal oscillator (VCXO) 180, the oscillation frequency of the voltage controlled crystal oscillator (VCXO) 180 does not change. Accordingly, the feedback control is performed so that $f_1-f_2=f_{12}+\Delta_3$ (the frequency $f_m=(f_{12}+\Delta_3)/2$ of the frequency conversion circuit 120).

As described above, if the EIT signal is left-right asymmetrical, since the detection signal intensity of the light detector 130 also becomes left-right asymmetrical around the frequency difference $f_1-f_2=f_{12}$ of the resonant light beam pair, the feedback control is performed and the frequency difference $f_1-f_2$ of the resonant light beam pair is stable in a state matched with the frequency shifted slightly from the frequency $f_{12}$ corresponding to $\Delta E_{12}$ so that the detection signal intensity of the light detector 130 becomes the value shifted slightly from the peak. Even when the frequency is shifted, high frequency stability can be ensured.

Figure 10:
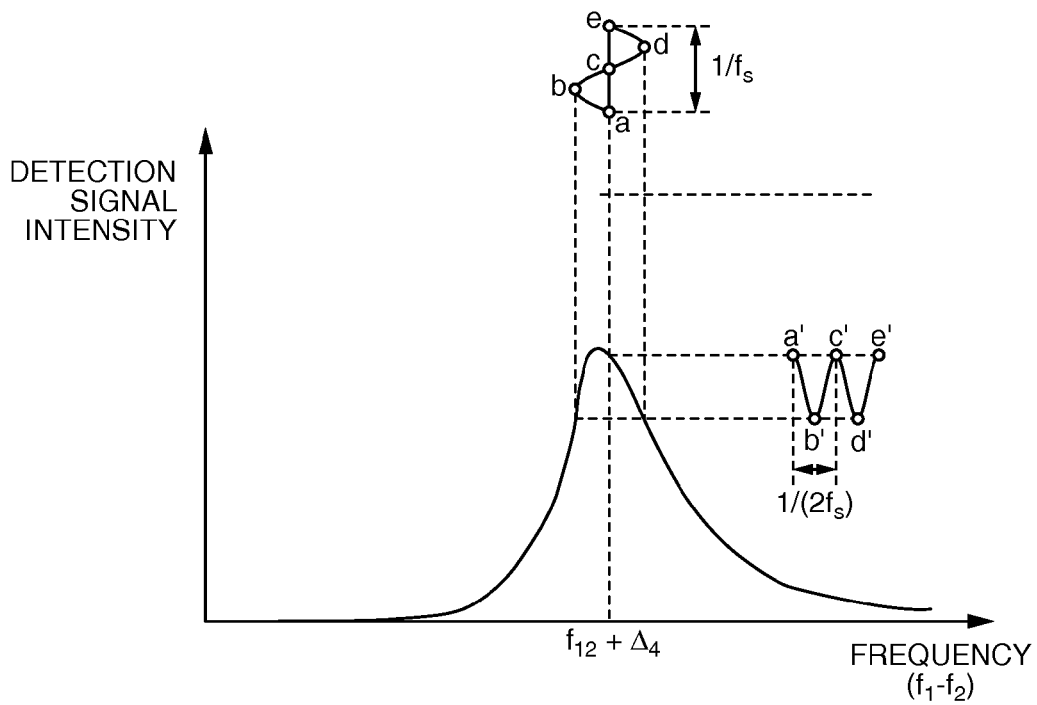
FIG. 10 is an explanatory view for the detection.

By the way, it is conceivable that the peak value (the intensity) of the EIT signal may change and accordingly, the line width of the EIT signal may change by a cause that the temperature of the gas cell 120 becomes unstable or the like. For example, when the oscillation frequency of the voltage controlled crystal oscillator (VCXO) 180 is stable in a state of ($f_1-f_2=f_{12}+\Delta_3$) in FIG. 9B, the peak value (the intensity) of the EIT signal is decreased and then when the line width becomes large as shown in FIG. 10, the amplitude of the low frequency component of the frequency $2f_s$ included in the detection signal of the light detector 130 becomes constant and the oscillation frequency of the voltage controlled crystal oscillator (VCXO) 180 is stable in a state of $f_1-f_2=f_{12}+\Delta_4$. When comparing the example of FIG. 9B to the example of FIG. 10, $\Delta_4 \neq \Delta_3$ ($\Delta_4 > \Delta_3$) and when the peak value (the intensity) of the EIT signal decreases, the oscillation frequency of the voltage controlled crystal oscillator (VCXO) 180 shifts to the higher side. Accordingly, when the EIT signal is left-right asymmetrical, if the peak value (the intensity) of the EIT signal changes and then the line width changes, there is a possibility that frequency stability is degraded.

Figure 11:
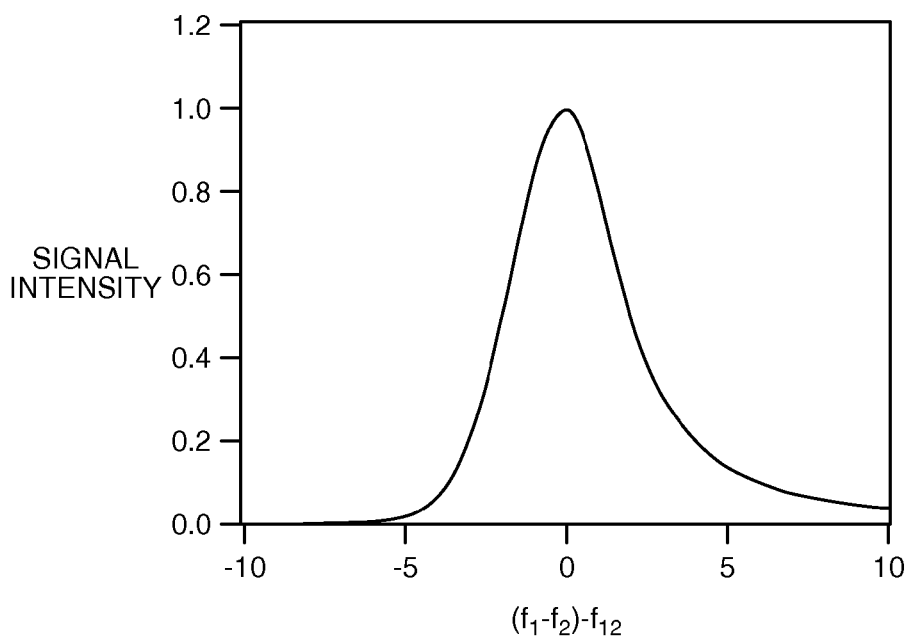
FIG. 11 is a view illustrating a model of the EIT signal having the left-right asymmetry in a graph.
Figure 12:
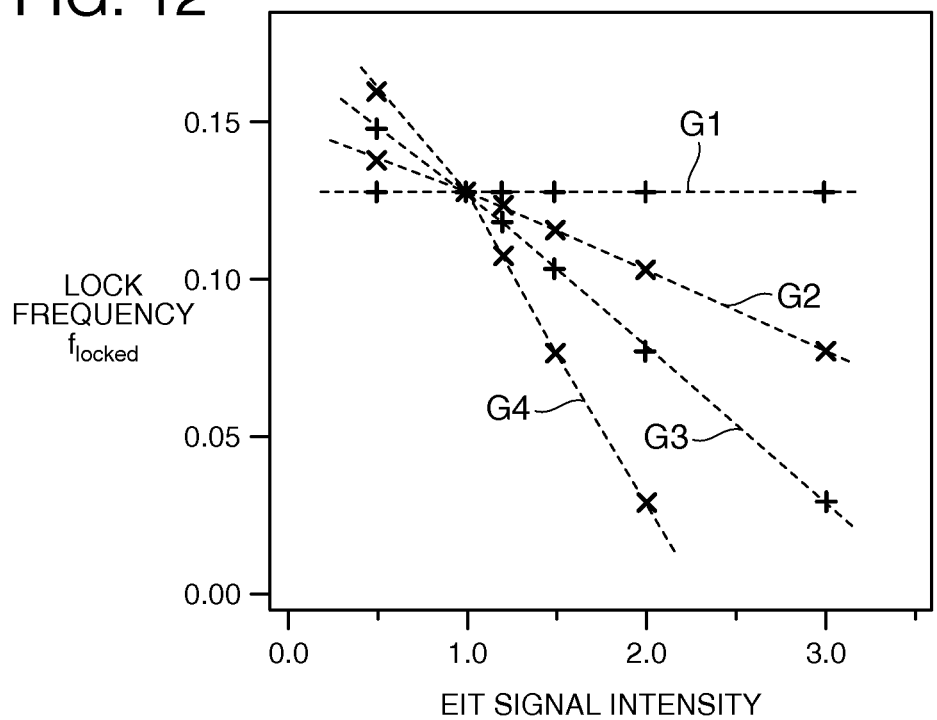
FIG. 12 is a view illustrating simulation results of relation between EIT signal intensity and lock frequency.

Accordingly, when the EIT signal is left-right asymmetrical, even though the peak value (the intensity) of the EIT signal changes and then the line width changes, there is a need to consider some measures so that the oscillation frequency of the voltage controlled crystal oscillator (VCXO) 180 does not change. Then, the EIT signal having the left-right asymmetry is modeled and the peak value (the intensity) of the EIT signal is changed and then a shape of the change of the frequency (the lock frequency $f_{locked}$) of the output signal of the frequency conversion circuit 220 is confirmed by simulation when the voltage controlled crystal oscillator (VCXO) 180 oscillates stably. FIG. 11 is a view illustrating the model of the EIT signal having the left-right asymmetry in a graph and FIG. 12 is a view illustrating simulation results. Unit in each axis is arbitrary unit in FIG. 11 and the lateral axis is the value of $(f_1-f_2)-f_{12}$, and the vertical axis the intensity of light which passes through the gas cell 120. In addition, Unit in each axis is arbitrary unit in FIG. 12 and the lateral axis is the EIT signal intensity, and the vertical axis is the lock frequency $f_{locked}$. Four graphs G1, G2, G3 and G4 shown in FIG. 12 are simulation results of models in which degrees (BF: Broadening Factor) of the line width changes of the EIT signals are 0, 0.5. 1.0 and 2.0, respectively, according to the change of the EIT signal intensity. In addition, BF=0 is a model in which the line width change of the EIT signal does not occur according to the change of the EIT signal intensity. According to the simulation results in FIG. 12, the lock frequency $f_{locked}$ linearly decreases according to the increase of the EIT signal intensity.

Figure 13:
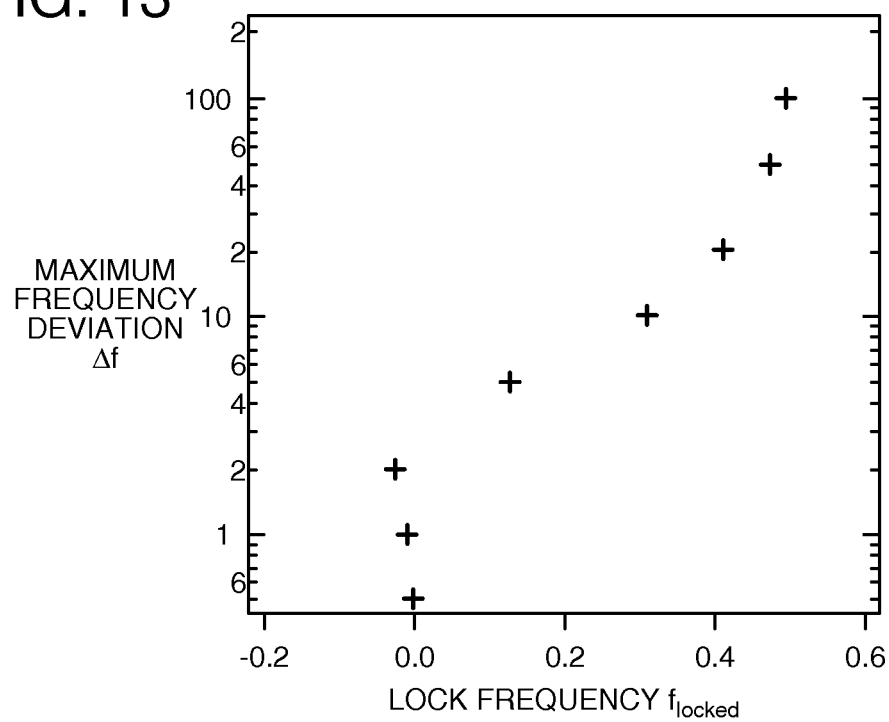
FIG. 13 is a view illustrating the simulation results of the relation between the lock frequency and maximum frequency deviation.

In addition, when the EIT signal is left-right asymmetrical, if the amplitude $A_S$ (the maximum frequency deviation $\Delta_f$ in the frequency modulation of the frequency modulation circuit 190) of the oscillation signal of the low-frequency oscillator 200 is changed, it is conceivable that the signal waveform having frequency $f_s$ or $2f_s$ included in the output signal of the detection circuit 170 is changed and the lock frequency $f_{locked}$ is changed according to the principle of synchronous detection described above. Then, the maximum frequency deviation $\Delta f$ is changed while the EIT signal intensity is constant for the model of the EIT signal having the left-right asymmetry shown in FIG. 11, and then the shape of the change of the lock frequency $f_{locked}$ is confirmed by the simulation. FIG. 13 is a view illustrating the simulation results. Unit in each axis is arbitrary unit in FIG. 13 and the lateral axis is the lock frequency $f_{locked}$, and the vertical axis is the maximum frequency deviation $\Delta f$. According to the simulation results in FIG. 13, the lock frequency $f_{locked}$ monotonically increases according to the increase of the maximum frequency deviation $\Delta f$.

Figure 14:
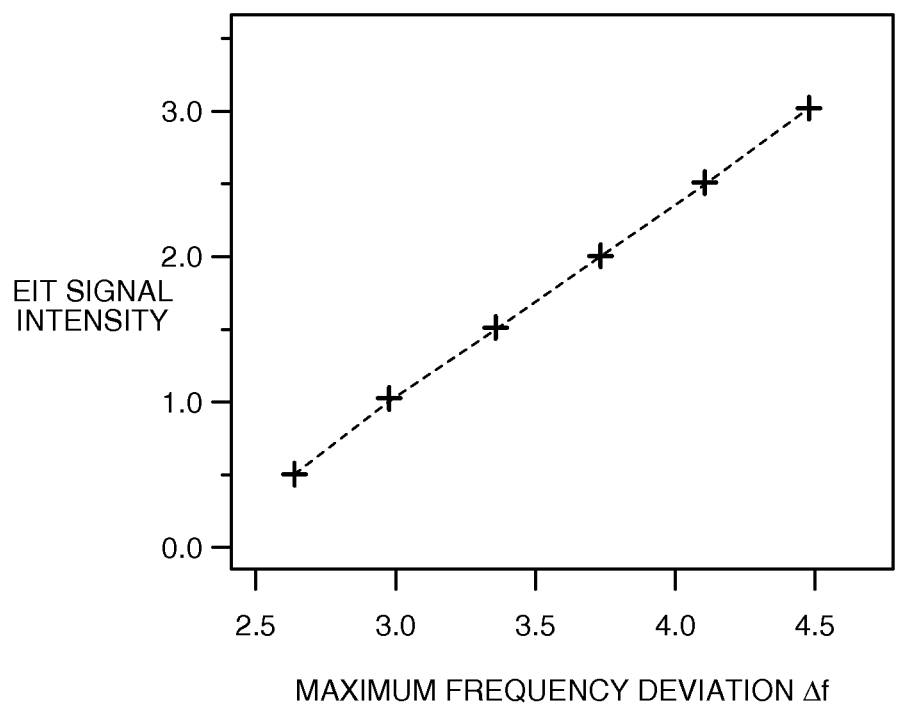
FIG. 14 is a view illustrating the simulation results of relation between the maximum frequency deviation and the EIT signal intensity for maintaining lock frequency constantly.

Even though the EIT signal intensity changes, the maximum frequency deviation $\Delta f$ is appropriately changed according to the degree of the change thereof so that it is conceivable that the lock frequency $f_{locked}$ can be maintained constant by the simulation results in FIG. 12 and the simulation results in FIG. 13. Specifically, the maximum frequency deviation $\Delta f$ is optimally changed according to the change of the EIT signal intensity so that it is conceivable that the lock frequency $f_{locked}$ may be maintained constant in a state (a state that the peak of the EIT signal is detected) that the lock frequency $f_{locked}$ is not deviated from $f_{12}/2$ by a state of nonlinearity of the EIT signal. FIG. 14 is a view illustrating the simulation results of relation between the maximum frequency deviation $\Delta f$ and the EIT signal intensity for maintaining the lock frequency $f_{locked}$ constantly in a state where the lock frequency $f_{locked}$ is not slightly shifted from $f_{12}/2$. According to the simulation results in FIG. 14, the maximum frequency deviation $\Delta f$ is substantially linearly increased for the increase of the EIT signal intensity so that the lock frequency $f_{locked}$ can be maintained constant.

Since the maximum frequency deviation $\Delta f$ is proportional to the amplitude $A_s$ of the oscillation signal of the low-frequency oscillator 200 in the frequency modulation of the frequency modulation circuit 190, the maximum frequency deviation $\Delta f$ can be changed by changing the amplitude of the oscillation signal of the low-frequency oscillator 200. In addition, the change of the EIT signal intensity appears as the change of the level of the detection signal (the DC component) of the light detector 130. Accordingly, the amplitude of the oscillation signal of the low-frequency oscillator 200 is changed according to a predetermined corresponding relation as shown in FIG. 14 so that it is conceivable that the lock frequency $f_{locked}$ may be maintained constant by the level of the detection signal of the light detector 130.

Then, in the atomic oscillator 1a of the embodiment, the amplitude control circuit 210 is added. The amplitude of the oscillation signal of the low-frequency oscillator 200 is controlled by the amplitude control circuit 210 according to the predetermined corresponding relation depending on the level of the detection signal of the light detector 130. For example, a model that matches to the practical EIT signal obtained in a sample evaluation or the like is made and various simulations described above are performed and then formula of the maximum frequency deviation Δf for maintaining constantly the lock frequency $f_{locked}$ is obtained by the polynomial approximation, wherein the EIT signal intensity is a variable.

Thus, the amplitude control circuit 210 controls the amplitude of the oscillation signal of the low-frequency oscillator 200 so that the amplitude control circuit 210 follows the formula of maximum frequency deviation Δf.

In addition, in the amplitude control circuit 210 the amplitude of the oscillation signal of the low-frequency oscillator 200 may be controlled by changing a gain of a variable gain amplifier according to the level of the detection signal of the light detector 130. In addition, the amplitude of the oscillation signal of the low-frequency oscillator 200 may be controlled by changing attenuation of a variable attenuator according to the level of the detection signal of the light detector 130.

As described above, according to the atomic oscillator of the embodiment, the amplitude control circuit 210 is provided and then the variation of the lock frequency due to the change of the EIT signal intensity can be canceled by the variation of the lock frequency due to the change of the maximum frequency deviation Δf. Accordingly, the lock frequency can be maintained constant even though the EIT signal intensity changes. Accordingly, the atomic oscillator having frequency stability higher than that of the related art can be realized. Specifically, when the polynomial of the maximum frequency deviation Δf for maintaining the lock frequency $f_{locked}=f_{12}/2$ is obtained, the atomic oscillator having the frequency accuracy and the frequency stability higher than those of the related art can be realized.

2-2. Second Embodiment

In the atomic oscillator of the first embodiment, the formula of maximum frequency deviation Δf does not change, however, it is assumed that EIT signal characteristics may be different between the samples due to variation of the manufacturing conditions or the like. Then, in the atomic oscillator of the second embodiment, the formula of maximum frequency deviation Δf is corrected according to the EIT signal characteristics of each sample.

Figure 15:
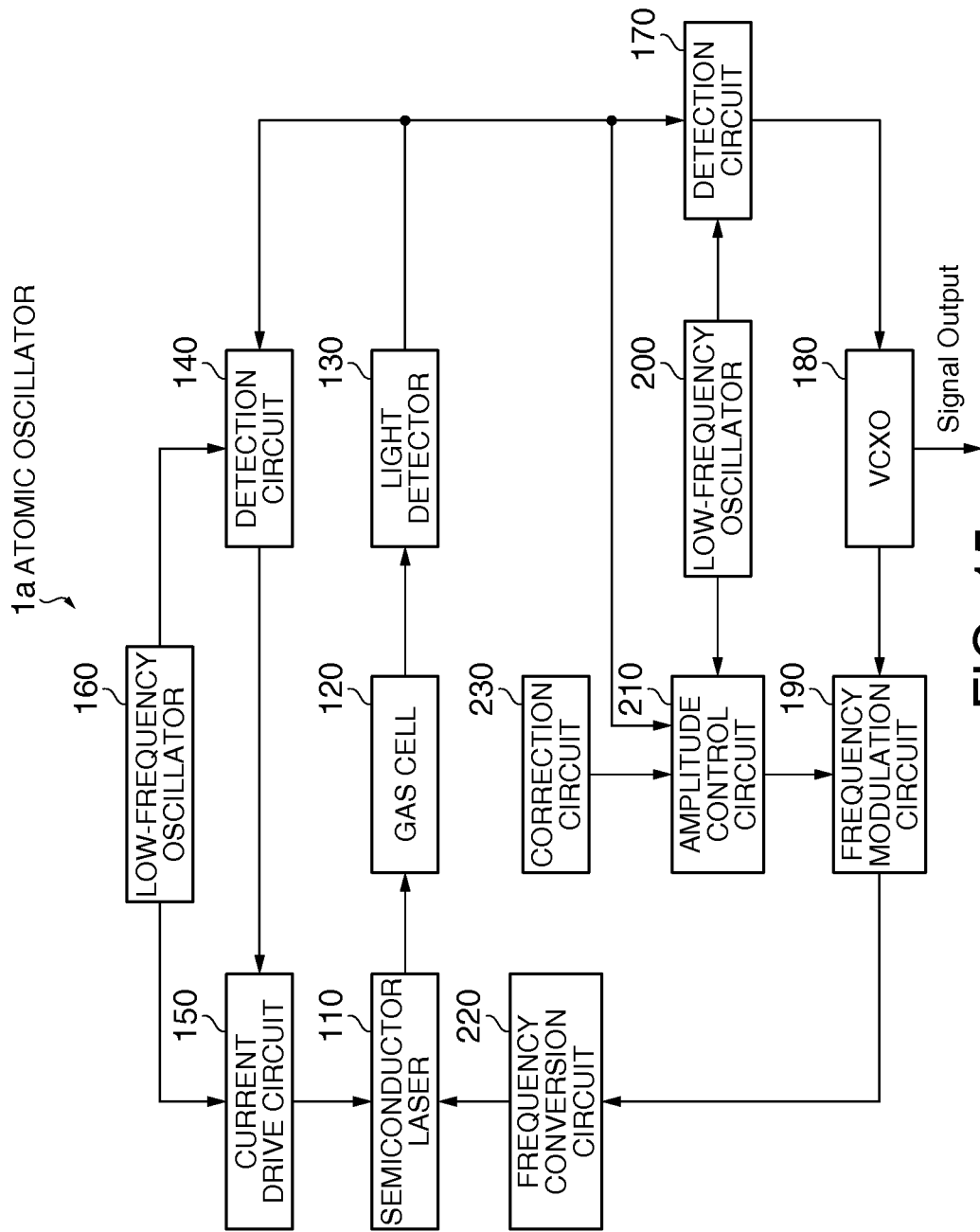
FIG. 15 is a view illustrating a configuration example of the atomic oscillator of a second embodiment.

FIG. 15 is a view illustrating a configuration example of the atomic oscillator of the second embodiment. As shown in FIG. 15, in the atomic oscillator 1a of the second embodiment, a correction circuit 230 is added to the atomic oscillator 1a of the first embodiment shown in FIG. 3. In addition, since other configuration in the second embodiment is the same as that of the first embodiment, the same reference numeral is denoted and description thereof is omitted.

The correction circuit 230 corrects the formula of maximum frequency deviation Δf used in the amplitude control of the oscillation signal of the low-frequency oscillator 200 with the amplitude control circuit 210. For example, in the design phase, the formula (the polynomial) of maximum frequency deviation Δf is obtained by the polynomial approximation and then the amplitude control circuit 210 is designed so that the amplitude of the oscillation signal of the low-frequency oscillator 200 is controlled according to the polynomial. Thus, when testing each sample or the like, the practical EIT signal characteristics are evaluated and accurate formula of the maximum frequency deviation Δf is obtained. The information of the accurate formula of the maximum frequency deviation Δf is stored in the correction circuit 230 and the amplitude control circuit 210 controls the amplitude of the oscillation signal of the low-frequency oscillator 200 according to the accurate formula of the maximum frequency deviation Δf. For example, the correction circuit 230 can be configured by writing in a writable non-volatile memory each coefficient value of the accurate formula (the polynomial) of the maximum frequency deviation Δf or difference between each coefficient value of the accurate formula (the polynomial) of the maximum frequency deviation Δf and each coefficient value of the formula (the polynomial) in the design phase. In the former case, the amplitude control circuit 210 controls the amplitude of the oscillation signal of the low-frequency oscillator 200 according to the polynomial of each coefficient value written in the non-volatile memory. In the latter case, the amplitude control circuit 210 obtains the accurate coefficient value from the difference of each coefficient value written in the non-volatile memory and then controls the amplitude of the oscillation signal of the low-frequency oscillator 200 according to the polynomial formula of the accurate coefficient.

Since other configuration in the second embodiment is the same as that of the first embodiment, the same reference numeral is denoted and description thereof is omitted.

In addition, the semiconductor laser 110, the alkali metal atom included in the gas cell 120, the light detector 130 and the detection circuit 170 in FIG. 15 correspond to the light generation section 10, the metal atom 20, the light detection section 30 and the frequency controller 50 in FIG. 1, respectively. In addition, the configuration by the amplitude control circuit 210 and the correction circuit 230 in FIG. 15 corresponds to the maximum frequency deviation controller 60 in FIG. 1. In addition, the configuration by the voltage controlled crystal oscillator (VCXO) 180, the frequency modulation circuit 190, the low-frequency oscillator 200 and the frequency conversion circuit 220 in FIG. 15 corresponds to the control signal output section 40 in FIG. 1. In addition, the voltage controlled crystal oscillator (VCXO) 180, the low-frequency oscillator 200, the frequency modulation circuit 190 and the frequency conversion circuit 220 in FIG. 15 correspond to the oscillation signal output section 42, the modulation signal output section 44, the frequency modulation section 46 and the frequency conversion section 48 in FIG. 1, respectively.

According to the atomic oscillator of the second embodiment, the variation of the EIT signal characteristics between the samples can be absorbed by storing the formula of maximum frequency deviation Δf which is appropriate for every sample in the non-volatile memory. Accordingly, the high frequency stability can be ensured without depending on the samples.

2-3. Third Embodiment

In the atomic oscillator of the second embodiment, the variation (initial variation) of the EIT signal characteristics between the samples can be absorbed by providing the correction circuit 230. However, when the EIT signal characteristics changes across the ages, since the accurate formula of maximum frequency deviation Δf also changes accordingly, in the atomic oscillator of the second embodiment, it is conceivable that the accuracy of the amplitude control of the oscillation signal of the low-frequency oscillator 200 decreases with across the ages. Then, in the atomic oscillator of the third embodiment, the formula of the maximum frequency deviation Δf is configured to be rewritable.

Figure 16:
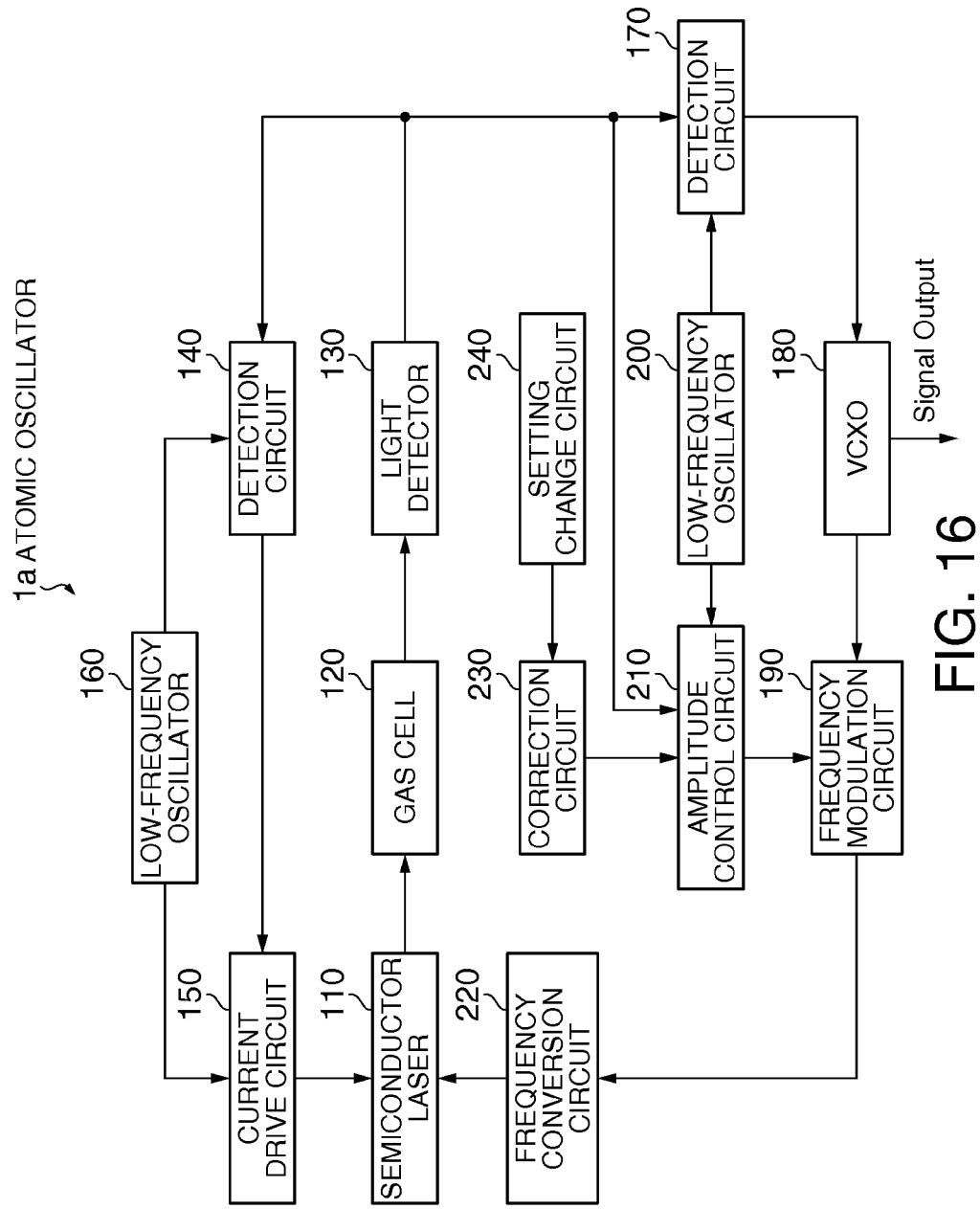
FIG. 16 is a view illustrating a configuration example of the atomic oscillator of a third embodiment.

FIG. 16 is a view illustrating a configuration example of the atomic oscillator of the third embodiment. As shown in FIG. 16, in the atomic oscillator 1a of the third embodiment, a setting change circuit 240 is added to the atomic oscillator 1a of the second embodiment shown in FIG. 15.

The setting change circuit 240 rewrites the formula (specifically, each coefficient value) of the maximum frequency deviation Δf used in the amplitude control of the oscillation signal of the low-frequency oscillator 200 by the amplitude control circuit 210. For example, the non-volatile memory of the correction circuit 230 is configured of an interface circuit which is rewritable from the outside. For example, clock signal and serial data signal are input from the outside to the setting change circuit 240 and a writing address, writing data (each coefficient value), write signal or the like is output in the non-volatile memory.

Since other configuration in the third embodiment is the same as that of the first embodiment and that of the second embodiment, the same reference numeral is denoted and description thereof is omitted.

In addition, the semiconductor laser 110, the alkali metal atom included in the gas cell 120, the light detector 130, the detection circuit 170 and the setting change circuit 240 in FIG. 16 correspond to the light generation section 10, the metal atom 20, the light detection section 30, the frequency controller 50 and the maximum frequency deviation information changing section 70 in FIG. 2, respectively. In addition, the configuration by the amplitude control circuit 210 and the correction circuit 230 in FIG. 16 corresponds to the maximum frequency deviation controller 60 in FIG. 2. In addition, the configuration by the voltage controlled crystal oscillator (VCXO) 180, the frequency modulation circuit 190, the low-frequency oscillator 200 and the frequency conversion circuit 220 in FIG. 16 corresponds to the control signal output section 40 in FIG. 2. In addition, the voltage controlled crystal oscillator (VCXO) 180, the low-frequency oscillator 200, the frequency modulation circuit 190 and the frequency conversion circuit 220 in FIG. 16 correspond to the oscillation signal output section 42, the modulation signal output section 44, the frequency modulation section 46 and the frequency conversion section 48 in FIG. 2, respectively.

According to the atomic oscillator of the third embodiment, even though the EIT signal characteristics change with across the ages, high frequency stability can be maintained over the long term by obtaining again the formula of the maximum frequency deviation Δf and by updating the information stored in the non-volatile memory. For example, the EIT signal characteristics are evaluated, each coefficient value of the formula of maximum frequency deviation Δf is obtained and then each coefficient value stored in the non-volatile memory may be updated during maintenance.

3. MODIFICATION EXAMPLE

The invention is not limited to the embodiments and various modification examples are possible within the scope of the gist of the invention.

3-1. Modification Example 1

For example, in the atomic oscillator 1a in the embodiment, the drive current is controlled by the current drive circuit 150 so that the center wavelength $\lambda_0$ (the center frequency $f_0$) of the semiconductor laser 110 is substantially matches with the wavelength $\lambda_2$ (the frequency $f_2$) corresponding to the energy difference between the excited level (may be the excited level of I+1/2) of I−1/2 of $^2P_{1/2}$ of the alkali metal atom enclosed in the gas cell 120 and the ground level of I+1/2 of $^2S_{1/2}$. In addition, the frequency conversion circuit 220 may be deformed so that the output signal of the frequency modulation circuit 190 is converted to the signal having the frequency equal to the frequency corresponding to $\Delta E_{12}$. Otherwise, in the atomic oscillator 1a of the embodiment, the drive current is controlled by the current drive circuit 150 so that the center wavelength $\lambda_0$ (the center frequency $f_0$) of the semiconductor laser 110 substantially matches with the wavelength $\lambda_2$ (the frequency $f_1$) corresponding to the energy difference between the excited level (may be the excited level of I+1/2) of the I−1/2 of $^2P_{1/2}$ of the alkali metal atom enclosed in the gas cell 120 and the ground level of I−1/2 of $^2S_{1/2}$. In addition, the frequency conversion circuit 220 may be deformed so that the output signal of the frequency modulation circuit 190 is converted to the signal of the frequency equal to the frequency corresponding to $\Delta E_{12}$. In the former case, the center wavelength $\lambda_0$ is controlled to match with $\lambda_2$ (the center frequency $f_0$ matches with $f_2$) and in the latter case, the center wavelength $\lambda_0$ is controlled to match with $\lambda_1$ (the center frequency $f_0$ matches with $f_1$).

Figure 17A:
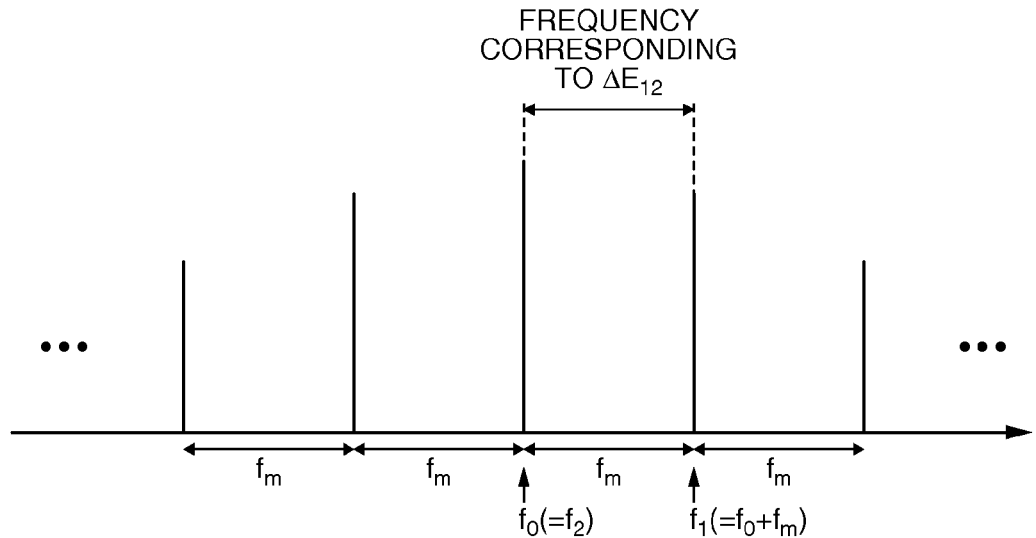
FIGS. 17A and 17B are schematic views illustrating the frequency spectrum of the light beam emitted from the semiconductor laser in the atomic oscillator of a modification example 1.
Figure 17B:
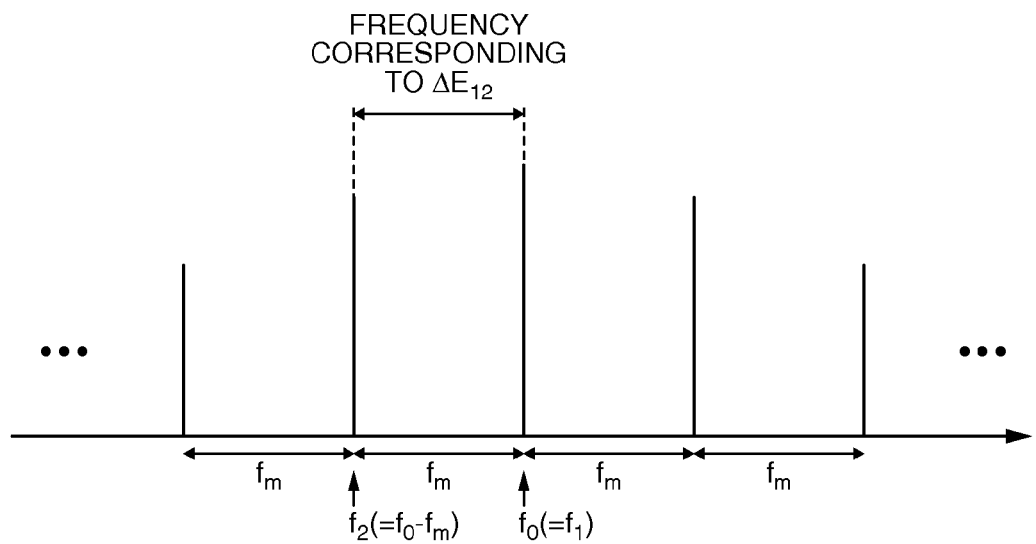

FIG. 17A is a schematic view illustrating the frequency spectrum of the light beam emitted from the semiconductor laser 110 of the former case and FIG. 17B is a schematic view illustrating the frequency spectrum of the light beam emitted from the semiconductor laser 110 of the latter case. In FIGS. 17A and 17B, the lateral axis is the frequency of the light beam and the vertical axis is the intensity of light beam. In a case of FIG. 17A, since the difference $f_1-f_0$ between $f_1$ and $f_0$ is substantially the same as the frequency corresponding to $\Delta E_{12}$, the light beam having the frequency $f_1$ and the light beam having the center frequency $f_0$ become the resonant light beam pair producing the EIT phenomenon in the alkali metal atoms enclosed in the gas cell 120. Meanwhile, in a case of FIG. 17B, since difference $f_0-f_2$ between $f_0$ and $f_2$ substantially equals to the frequency corresponding to $\Delta E_{12}$, the light beam having the center frequency $f_0$ and the light beam having frequency $f_2$ become the resonant light beam pair producing the EIT phenomenon in the alkali metal atoms enclosed in the gas cell 120.

3-2. Modification Example 2

Figure 18:
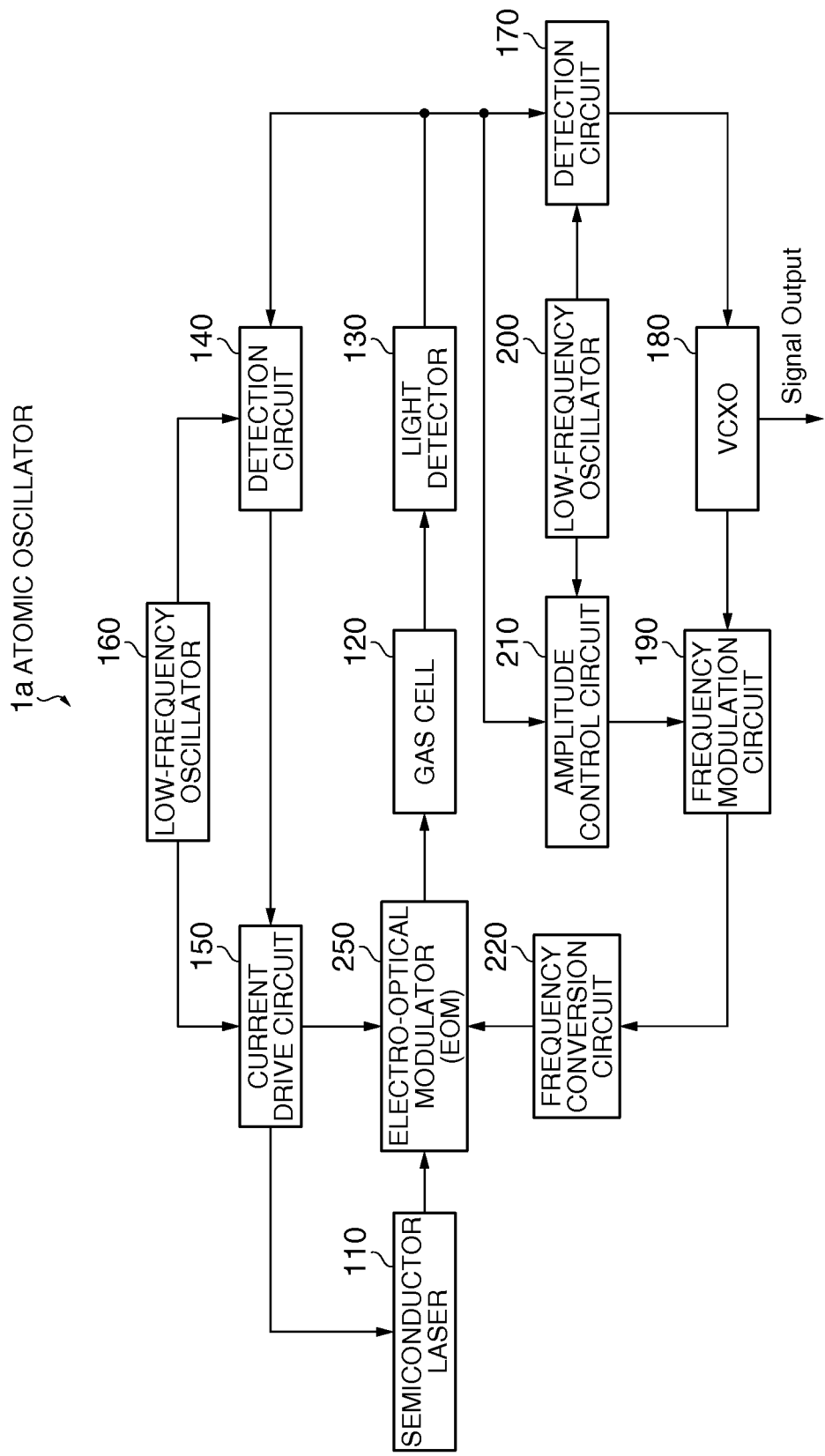
FIG. 18 is a view illustrating a configuration example of the atomic oscillator of a modification example 2.
Figure 19:
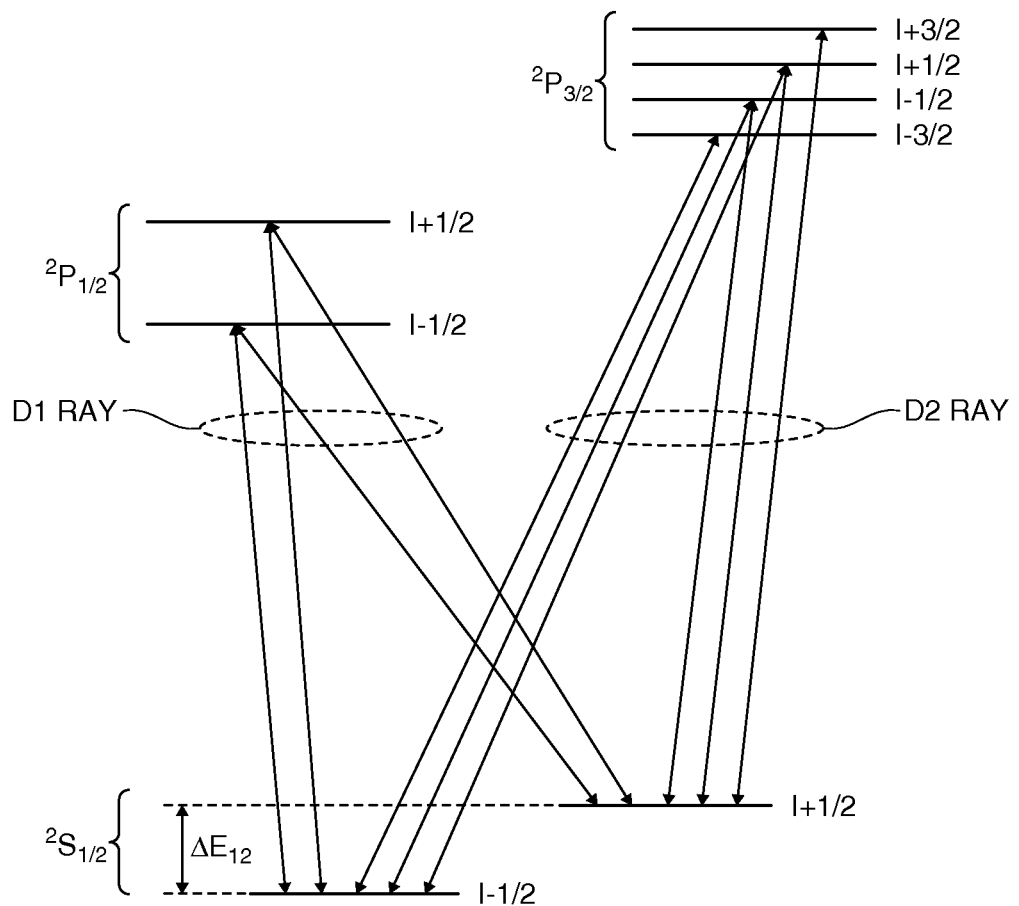
FIG. 19 is a view schematically illustrating an energy level of an alkali metal atom.
Figure 20:
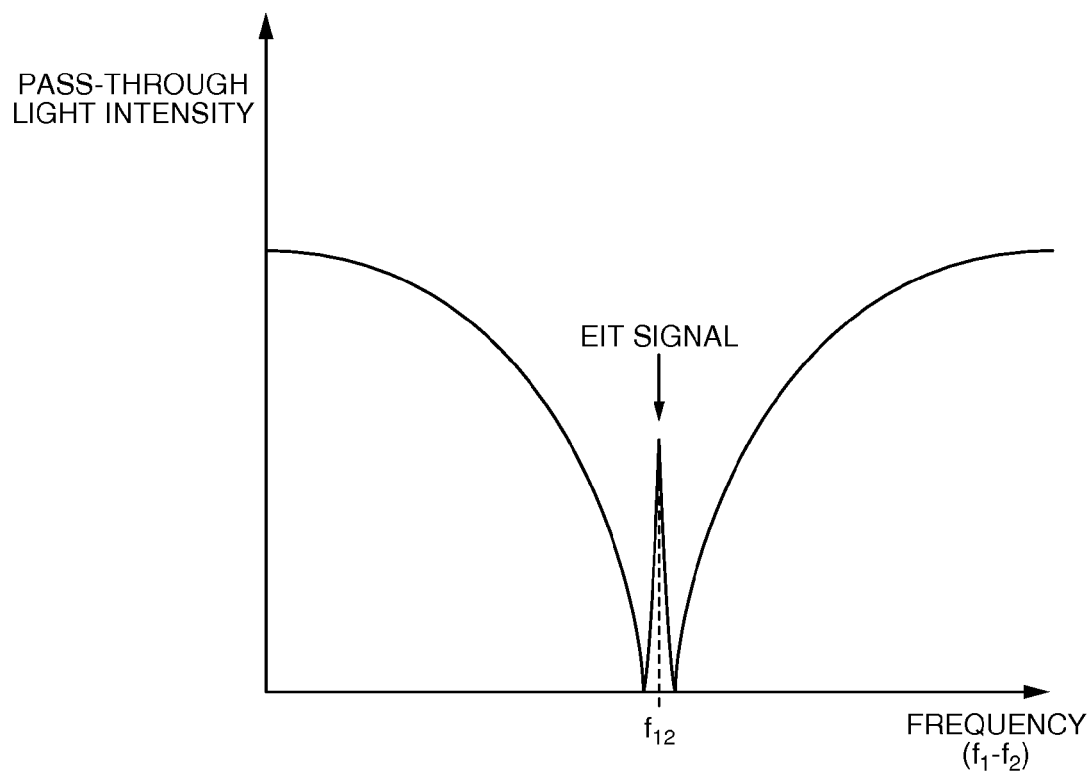
FIG. 20 is a schematic view illustrating an example of the EIT signal.
Figure 21:
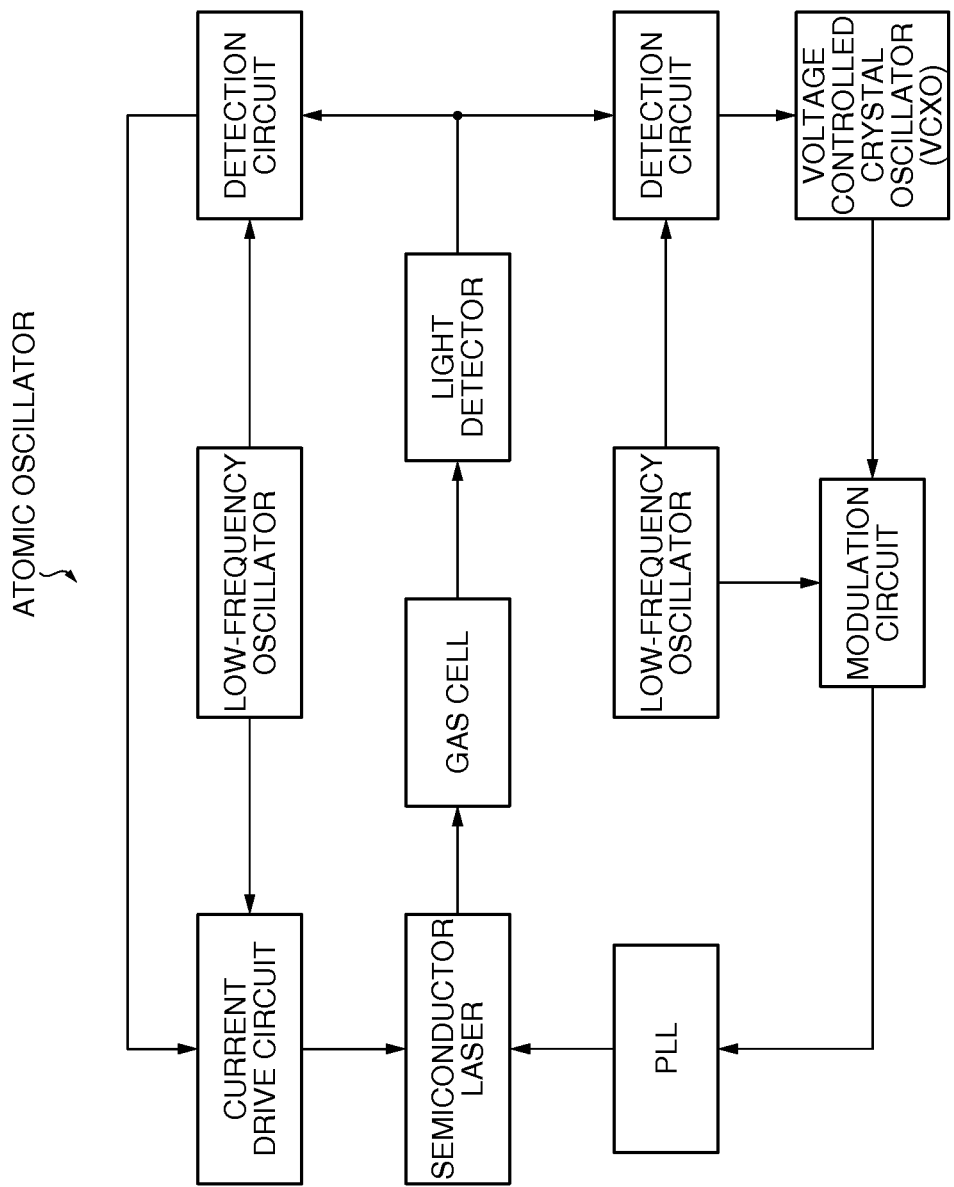
FIG. 21 is a schematic view of a general configuration of the atomic oscillator having an EIT system of the related art.

In addition, for example, as shown in FIG. 18, the atomic oscillator 1a of the first embodiment shown in FIG. 3 may be deformed to the configuration which uses an EOM (Electro-Optical Modulator). In FIG. 18, the same reference numeral is denoted in the configuration that is the same in FIG. 1 and description thereof is omitted.

In the atomic oscillator 1a shown in FIG. 18, the semiconductor laser 110 is not modulated by the output signal (the modulation signal) of the frequency conversion circuit 220 and produces the light beam having the single frequency $f_0$. The light beam having the frequency $f_0$ is incident on an electro-optical modulator (EOM) 250 and modulated by the output signal (the modulation signal) of the frequency conversion circuit 220. As a result, the light beam having the frequency spectrum similar to FIG. 4 can be produced. In the atomic oscillator 1a shown in FIG. 18, the configuration by the semiconductor laser 110 and the electro-optical modulator (EOM) 250 corresponds to the light generation section 10 in FIG. 1.

In addition, an AOM (Acousto-Optic Modulator) may be used instead of the electro-optical modulator (EOM) 250.

Similarly, the atomic oscillator of the second embodiment or the third embodiment may be deformed to the configuration using the electro-optical modulator (EOM) or the acousto-optic modulator (AOM).

In addition, in the embodiments and the modification examples, the atomic oscillator is exemplified, however, the invention is not limited to the atomic oscillator and can be applied to various quantum interference apparatuses in which the electromagnetically induced transparency phenomenon is produced in the metal atom by the resonant light beam pair.

For example, since the oscillation frequency of the voltage controlled crystal oscillator (VCXO) 180 changes following to the change of the magnetic field around of the gas cell 120 according to the configuration similar to the atomic oscillator of the embodiments or the modification examples, a magnetic measurement object is arranged near the gas cell 120 and then the quantum interference apparatus functioning as a magnetic sensor can be realized.

In addition, for example, according to the configuration similar to the atomic oscillator of the embodiments or the modification examples, since a quantum interference state (a quantum coherence state) of the metal atom, which is extremely stable, is produced, the quantum interference apparatus, which functions as a light source used in a quantum computer by taking out the resonant light beam pair which is input to the gas cell 120, can be realized.

In addition, for example, according to the configuration similar to the atomic oscillator of the embodiments or the modification examples, since coherence of the resonant light beam pair decreases and then the EIT signal intensity decreases when fine particles are present in a space between the semiconductor laser 110 and the gas cell 120, the quantum interference apparatus functioning as a fine particle sensor can be realized by analyzing the profile of the EIT signal.

The invention includes substantially the same configuration as the configuration described in the embodiments (for example, the configuration which has the same function, method and results or the configuration having the same object and effect). In addition, the invention includes a configuration which replaces a non-essential portion of the configuration described in the embodiments. In addition, the invention includes a configuration which achieves the same effects as the configuration described in the embodiments or includes a configuration which can obtain the same object as the configuration described in the embodiments. In addition, the invention includes the configuration in which a known technique is added to the configuration described in the embodiments.

The entire disclosure of Japanese Patent Application No. 2011-269998, filed Dec. 9, 2011 is expressly incorporated by reference herein.

What is claimed is:

1. A quantum interference apparatus comprising:
    a control signal output section which outputs a frequency-modulated control signal;
    a light generation section which produces a first light beam and a second light beam in which frequency difference with the first light beam is according to the frequency of the control signal;
    an atom to which a resonant light beam pair configured of the first light beam and the second light beam is irradiated and which produces an electromagnetically induced transparency phenomenon;
    a light detection section which detects the light beam passed through the atom;
    a frequency controller which controls the frequency of the control signal, based on the detection signal of the light detection section; and
    a maximum frequency deviation controller which controls maximum frequency deviation of the control signal, according to the detection signal of the light detection section.

2. The quantum interference apparatus according to claim 1,
    wherein the control signal output section comprises:
    an oscillation signal output section which outputs an oscillation signal of the frequency according to an output signal of the frequency controller;
    a modulation signal output section which outputs the modulation signal;
    a frequency modulation section which performs the frequency modulation from the oscillation signal to the modulation signal; and
    a frequency conversion section which converts the frequency of the output signal of the frequency modulation section and then outputs the control signal, and
    wherein the frequency controller detects the detection signal of the light detection section, based on the signal having the same frequency as the modulation signal, and
    wherein the maximum frequency deviation controller controls an amplitude of the modulation signal.

3. An atomic oscillator comprising the quantum interference apparatus according to claim 2.

4. The quantum interference apparatus according to claim 1,
    wherein the maximum frequency deviation controller stores information of a corresponding relation between detection signal intensity of the light detection section and the maximum frequency deviation of the control signal, and controls the maximum frequency deviation of the control signal, based on information of the corresponding relation.

5. The quantum interference apparatus according to claim 4, further comprising:
    a maximum frequency deviation information changing section which changes the information of the corresponding relation, based on the signal from the outside of an atomic oscillator.

6. An atomic oscillator comprising the quantum interference apparatus according to claim 4.

7. An atomic oscillator comprising the quantum interference apparatus according to claim 5.

8. An atomic oscillator comprising the quantum interference apparatus according to claim 1.

9. A control method of a quantum interference apparatus in which an electromagnetically induced transparency phenomenon is produced in an atom by a resonant light beam pair comprising:
    outputting a frequency-modulated control signal;
    producing a first light beam and a second light beam having frequency difference according to the frequency of the control signal;
    irradiating the first light beam and the second light beam to the atom;
    detecting the light beam which has passed through the atom;
    controlling the frequency of the control signal so that the first light beam and the second light beam become the resonant light beam pair, based on detection result of the detecting of the light; and controlling the maximum frequency deviation of the control signal, according to the detection result of the detecting of the light.

* * * * *